(12) United States Patent
Murakami et al.

(10) Patent No.: US 11,706,921 B2
(45) Date of Patent: Jul. 18, 2023

(54) SEMICONDUCTOR STORAGE DEVICE

(71) Applicant: Kioxia Corporation, Tokyo (JP)

(72) Inventors: Yosuke Murakami, Yokkaichi Mie (JP); Satoshi Nagashima, Yokkaichi Mie (JP); Nobuyuki Momo, Yokohama Kanagawa (JP); Takayuki Ishikawa, Yokkaichi Mie (JP); Yusuke Arayashiki, Yokkaichi Mie (JP)

(73) Assignee: KIOXIA CORPORATION, Tokyo (JP)

(*) Notice: Subject to any disclaimer, the term of this patent is extended or adjusted under 35 U.S.C. 154(b) by 364 days.

(21) Appl. No.: 17/190,871

(22) Filed: Mar. 3, 2021

(65) Prior Publication Data

US 2022/0085058 A1 Mar. 17, 2022

(30) Foreign Application Priority Data

Sep. 15, 2020 (JP) .................................. 2020-154398

(51) Int. Cl.
| | |
|---|---|
| *H10B 43/27* | (2023.01) |
| *H10B 41/27* | (2023.01) |
| *H10B 41/35* | (2023.01) |
| *G11C 7/18* | (2006.01) |
| *H01L 23/00* | (2006.01) |

(Continued)

(52) U.S. Cl.
CPC ............ *H10B 43/27* (2023.02); *G11C 7/18* (2013.01); *H01L 24/46* (2013.01); *H10B 41/10* (2023.02); *H10B 41/27* (2023.02); *H10B 41/35* (2023.02); *H10B 43/10* (2023.02); *H10B 43/35* (2023.02)

(58) Field of Classification Search
CPC ........ H10B 43/27; H10B 41/10; H10B 41/27; H10B 41/35; H10B 43/10; H10B 43/35; G11C 7/18; H01L 24/46
See application file for complete search history.

(56) References Cited

U.S. PATENT DOCUMENTS 9,691,973 B2   6/2017  Ino et al.
10,923,500 B2 * 2/2021  Ino .......................... H10B 53/30
(Continued)

OTHER PUBLICATIONS

H. Mulaosmanovica, et al., "Evidence of single domain switching in Hafnium Oxide based FeFETs: enabler for multi-level FeFET memory cells," NaMLab GMBH, Fraunhofer IPMS-CNT, IHM TU-Dresden, GLOBALFOUNDRIES, 2015, pgs. (3 total).

(Continued)

*Primary Examiner* — David Vu
*Assistant Examiner* — Brandon C Fox
(74) *Attorney, Agent, or Firm* — Foley & Lardner LLP

(57) ABSTRACT

A semiconductor storage device includes a substrate, a first wiring, a second wiring, a third wiring, a fourth wiring, a charge storage unit. The first wiring extends in a first direction along a surface of the substrate. The second wiring is aligned with the first wiring in a second direction intersecting with the first direction and extends in the first direction. The third wiring is in contact with the first wiring and the second wiring and includes a semiconductor. The fourth wiring is located between the first wiring and the second wiring, extends in a third direction intersecting with the first direction and the second direction, and is aligned with the third wiring in at least the first direction. The charge storage unit is located between the third wiring and the fourth wiring.

16 Claims, 15 Drawing Sheets

(51) Int. Cl.
*H10B 41/10* (2023.01)
*H10B 43/10* (2023.01)
*H10B 43/35* (2023.01)

(56) References Cited

U.S. PATENT DOCUMENTS

2010/0327323 A1* 12/2010 Choi .................. H10B 43/27
  257/E27.103
2015/0036429 A1* 2/2015 Kim .................. H01L 29/7926
  257/314
2021/0375919 A1* 12/2021 Wang .................. H10B 43/20

OTHER PUBLICATIONS

M. Kobayashi et al., "A Nonvolatile SRAM Integrated with Ferroelectric HfO2 Capacitor for Normally-Off and Ultralow Power IoT Application," The Institute of Industrial Science, The University of Tokyo, 2017, Symposium on VLSI Technology Digest of Technical Papers, pgs. (2 total).

Y. Noh et al., "Synaptic Devices Based on 3-D And Flash Memory Architecture for Neuromorphic Computing," Department of Electrical and Computer Engineering, ISRC (Inter-University Semiconductor Research Center), Seoul National University, 2019, pgs. (4 total).

\* cited by examiner

SEMICONDUCTOR STORAGE DEVICE

CROSS-REFERENCE TO RELATED APPLICATION(S)

This application is based upon and claims the benefit of priority from Japanese Patent Application No. 2020-154398, filed on Sep. 15, 2020, the entire contents of which are incorporated herein by reference.

FIELD

Embodiments described herein relate generally to a semiconductor storage device.

BACKGROUND

A semiconductor storage device including a stacked body in which insulating films and word lines are alternately stacked in the thickness direction of a substrate and a channel portion penetrating the stacked body in the thickness direction of the substrate is known.

DETAILED DESCRIPTION

Figure 1:
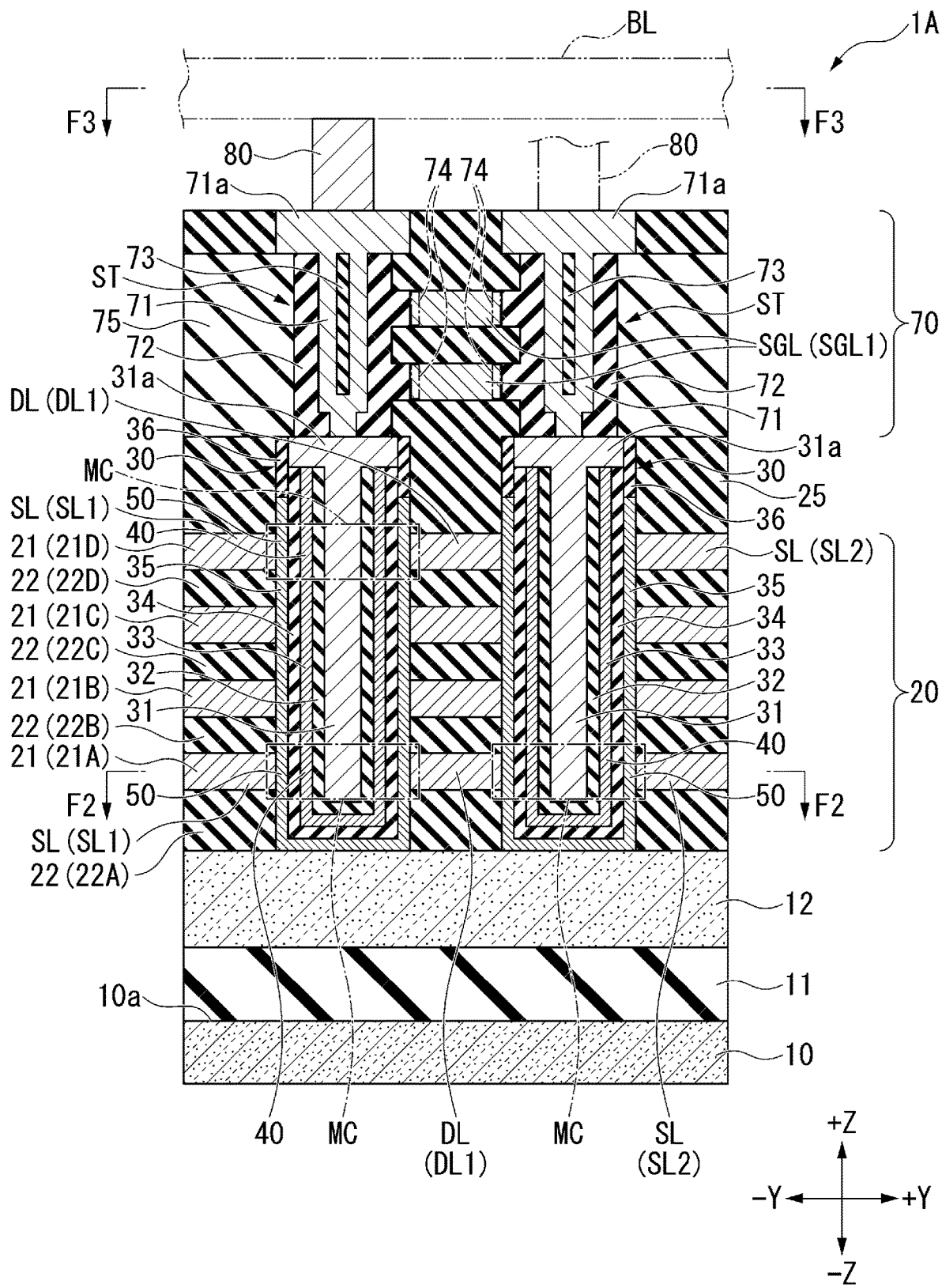
FIG. 1 is a cross-sectional view illustrating a semiconductor storage device of a first embodiment.

At least one embodiment provides a semiconductor storage device capable of shortening read time.

In general, according to at least one embodiment, the semiconductor storage device includes a substrate, a first wiring, a second wiring, a third wiring, a fourth wiring, and a charge storage unit. The first wiring extends in a first direction along a surface of the substrate. The second wiring is aligned with the first wiring in a second direction intersecting with the first direction and extends in the first direction. The third wiring is in contact with the first wiring and the second wiring and includes a semiconductor. The fourth wiring is located between the first wiring and the second wiring, extends in a third direction intersecting with the first direction and the second direction, and is aligned with the third wiring in at least the first direction. The charge storage unit is located between the third wiring and the fourth wiring.

Hereinafter, the semiconductor storage device of at least one embodiment will be described with reference to the drawings. In the following description, configurations having the same or similar functions are designated by the same reference numerals. Then, the redundant descriptions of those configurations may be omitted. In the present specification, the term "parallel" includes the case of "substantially parallel". In the present specification, the term "orthogonal" includes the case of "substantially orthogonal". As used herein, the term "connection" includes not only the case where two members are adjacent to each other without any intervention between them, but also the case where another member is interposed between the two members. As used herein, the term "annular" is not limited to an annular shape, but includes a rectangular or triangular annular shape. In the present specification, the phrase "XX is provided on YY" is not limited to the case where XX is in contact with YY, but includes the case where another member is interposed between XX and YY.

First, the +X direction, the −X direction, the +Y direction, the −Y direction, the +Z direction, and the −Z direction are defined. The +X direction, the −X direction, the +Y direction, and the −Y direction are directions along a surface $10a$ (see FIG. 1) of a silicon substrate 10 (to be described later). The +X direction is the direction in which a source line SL and a drain line DL (see FIG. 2), which will be described later, extend. The −X direction is opposite to the +X direction. When the +X direction and the −X direction are not distinguished from each other, the directions are simply referred to as an "X direction". The +Y direction and the −Y direction are directions that intersect (e.g., are orthogonal to each other) with the X direction. The +Y direction is the direction in which the bit line BL (see FIG. 3), which will be described later, extends. The −Y direction is opposite to the +Y direction. When the +Y direction and the −Y direction are not distinguished from each other, the directions are simply referred to as a "Y direction". The +Z direction and the −Z direction are directions that intersect (e.g., are orthogonal to each other) with the X and Y directions, and are the thickness directions of the silicon substrate 10 (see FIG. 1). The +Z direction is a direction from the silicon substrate 10 toward a stacked body 20 (to be described later). The −Z direction is opposite to the +Z direction. When the +Z direction and the −Z direction are not distinguished from each other, the directions are simply referred to as a "Z direction". In the present specification, the "+Z direction" may be referred to as "upward" and the "−Z direction" may be referred to as "downward". However, these expressions are for convenience only and do not specify the direction of gravity. The +X direction is an example of a "first direction". The +Y direction is an example of a "second direction". The +Z direction is an example of a "third direction".

First Embodiment

<1. Configuration of Semiconductor Storage Device>

First, the configuration of the semiconductor storage device 1A of the first embodiment will be described. The semiconductor storage device 1A is, for example, anonvolatile semiconductor storage device. In the drawings described below, the insulating portion not related to the description may not be illustrated.

FIG. 1 is a cross-sectional view illustrating the semiconductor storage device 1A. FIG. 1 is a cross-sectional view taken along line F1-F1 of the semiconductor storage device 1A illustrated in FIG. 2. The semiconductor storage device 1A includes, for example, a silicon substrate 10, an insulating layer 11, a semiconductor layer 12, a stacked body 20, an insulating portion 25, a plurality of pillars (columnar bodies) 30, an insulating portion STH (see FIG. 2), and an upper structure 70, a plurality of contacts 80, and a plurality of bit lines BL (only one bit line is illustrated in FIG. 1).

<1.1 Lower Structure of Semiconductor Storage Device>

The silicon substrate 10 is a substrate on which the semiconductor storage device 1A is based. At least a part of the silicon substrate 10 has a plate shape along the X direction and the Y direction. The silicon substrate 10 has a surface 10a facing the stacked body 20. The silicon substrate 10 is formed of a semiconductor material containing silicon (Si). The silicon substrate 10 is an example of a "substrate".

The insulating layer 11 is provided on the surface 10a of the silicon substrate 10. The insulating layer 11 has a layer shape along the X direction and the Y direction. The insulating layer 11 is formed of an insulating material such as silicon oxide ($SiO_2$). A part of a peripheral circuit may be provided between the silicon substrate 10 and the insulating layer 11 to operate the semiconductor storage device 1A.

The semiconductor layer 12 is provided on the insulating layer 11. The semiconductor layer 12 has a layer shape along the X direction and the Y direction. The semiconductor layer 12 is a stopper layer that prevents a memory trench MT from extending deeply (see FIG. 5) in the manufacturing process of the semiconductor storage device 1A (to be described later). The semiconductor layer 12 is formed of a semiconductor material such as polysilicon (poly-Si). When the depth of the memory trench MT is controlled by another factor, the semiconductor layer 12 may be omitted.

<1.2 Stacked Body>

Next, the stacked body 20 will be described. The stacked body 20 is provided on the semiconductor layer 12. The stacked body 20 includes a plurality of functional layers 21 (e.g., functional layers 21A to 21D) and a plurality of insulating layers 22 (e.g., insulating layers 22A to 22D). The plurality of functional layers 21 and the plurality of insulating layers 22 are alternately stacked one by one in the Z direction. In FIG. 1, for convenience of explanation, four functional layers 21 and four insulating layers 22 are illustrated, but in actuality, more functional layers 21 and insulating layers 22 may be stacked.

Figure 2:
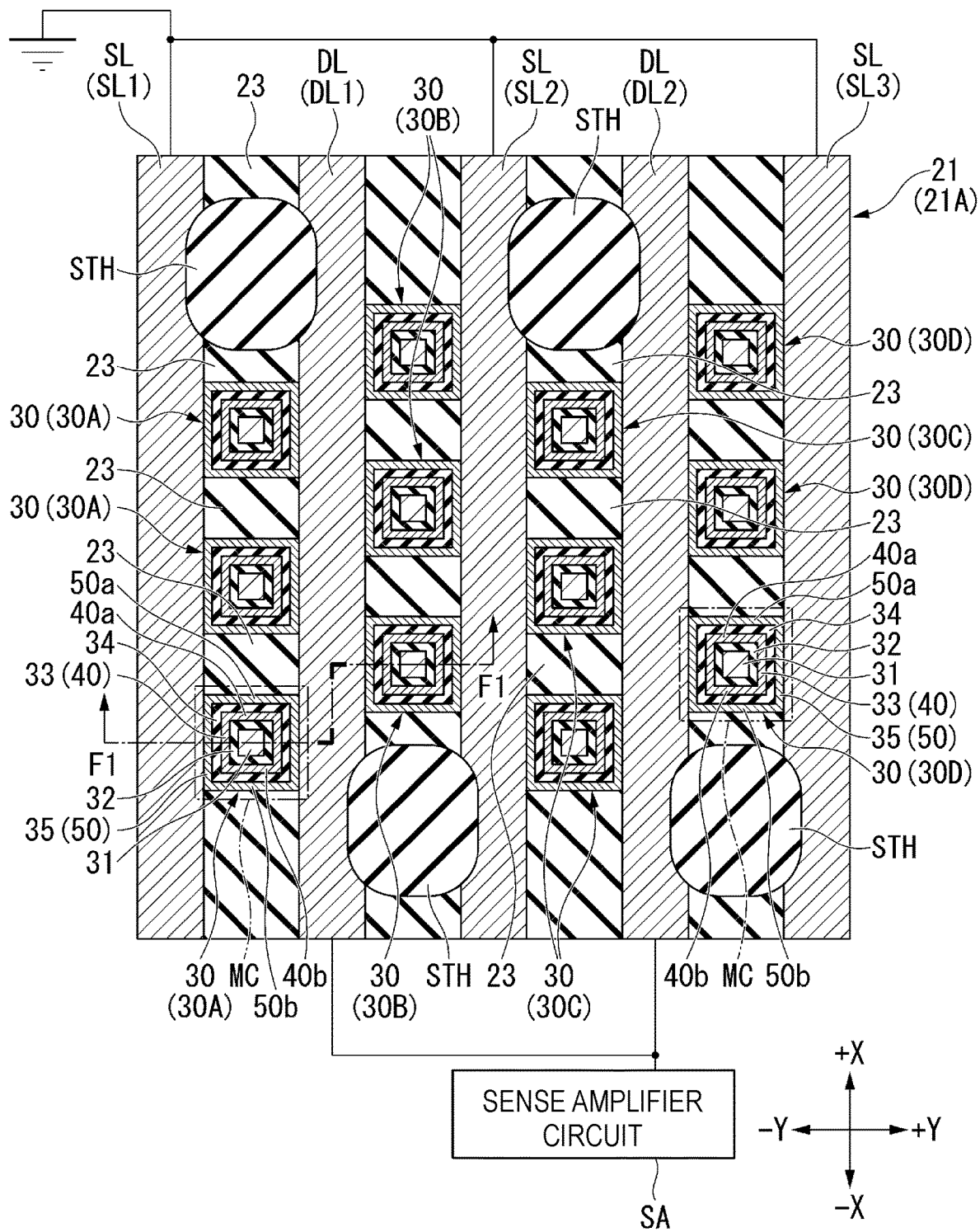
FIG. 2 is a cross-sectional view taken along line F2-F2 of the semiconductor storage device illustrated in FIG. 1.

FIG. 2 is a cross-sectional view taken along line F2-F2 of the semiconductor storage device 1A illustrated in FIG. 1. FIG. 2 is a cross-sectional view illustrating a first functional layer 21A. The first functional layer 21A includes a plurality of source lines SL (e.g., source lines SL1 to SL3), a plurality of drain line DLs (e.g., drain lines DL1 and DL2), and a plurality of insulating portions 23. The source line SL is an example of a "first wiring". The drain line DL is an example of a "second wiring".

Each of the plurality of source lines SL extends linearly in the X direction. The plurality of source lines SL are arranged in the Y direction at intervals from each other. Each of the plurality of drain lines DL extends linearly in the X direction. The plurality of drain lines DL are arranged in the Y direction at intervals from each other. The plurality of source lines SL and the plurality of drain lines DL are alternately arranged one by one in the Y direction. For example, the drain line DL1 is located between the source line SL1 and the source line SL2 in the Y direction. Another drain line DL2 is located between the source line SL2 and the source line SL3 in the Y direction. In other words, the source line SL2 is located on the opposite side to the source line SL1 in the Y direction with respect to the drain line DL1. The drain line DL2 is located on the opposite side to the drain line DL1 in the Y direction with respect to the source line SL2. The source line SL1 is an example of a "first source line". The source line SL2 is an example of a "second source line". The drain line DL1 is an example of a "first drain line". The drain line DL2 is an example of a "second drain line".

The plurality of source lines SL and the plurality of drain lines DL are conductive portions provided in the stacked body 20, and are wirings extending in the stacked body 20. The plurality of source lines SL and the plurality of drain lines DL are formed of a conductive material such as tungsten (W). In at least one embodiment, the phrase "drain line" means a wiring in which a current flows toward a channel portion 50 (to be described later). The drain line DL is connected to a sense amplifier circuit SA which is a part of the peripheral circuit of the semiconductor storage device 1A. The operation of the sense amplifier circuit SA will be described later. Meanwhile, in at least one embodiment, the phrase "source line" means a wiring in which a current flow through the channel portion 50 (to be described later). The source line SL is connected to the ground of the semiconductor storage device 1A. Meanwhile, the definitions of the "drain line" and the "source line" are not limited to the above examples. For example, the definitions of the "drain line" and the "source line" may be reversed from the above examples.

The insulating portion 23 is provided between the adjacent source line SL and drain line DL in the Y direction, and electrically insulates the adjacent source line SL and drain line DL. From another point of view, the insulating portion 23 is provided among a plurality of pillars 30 (to be described later) adjacent to each other in the X direction, and electrically insulates the plurality of pillars 30. The insulating portion 23 is formed of an insulating material such as silicon oxide ($SiO_2$).

The second to fourth functional layers 21B, 21C, and 21D also have the same configuration as the first functional layer 21A. That is, each of the second to fourth functional layers 21B, 21C, and 21D includes a plurality of source lines SL1 to SL3, a plurality of drain lines DL1 and DL2, and a plurality of insulating portions 23.

As illustrated in FIG. 1, the source lines SL of the first to fourth functional layers 21A to 21D are arranged in the Z direction at intervals from each other. The drain lines DL of the first to fourth functional layers 21A to 21D are arranged in the Z direction at intervals from each other. In other words, the plurality of source lines SL and the plurality of drain lines DL are arranged in a matrix at intervals in the Y direction and the Z direction. The source line SL1 in the second functional layer 21B is an example of a "third source line". The drain line DL1 in the second functional layer 21B is an example of the "third drain line".

The insulating layer 22 in the stacked body 20 is provided between two functional layers 21 adjacent to each other in the Z direction. The insulating layer 22 has a layer shape along the X direction and the Y direction. The insulating layer 22 is formed of an insulating material such as silicon oxide ($SiO_2$). The insulating layer 22 electrically insulates a plurality of source lines SL parallel to each other in the Z direction. The insulating layer 22 electrically insulates a plurality of drain lines DL parallel to each other in the Z direction.

The insulating portion 25 is provided on the uppermost functional layer 21 in the stacked body 20. The insulating portion 25 is located at the same height as the upper end of the pillar 30 (to be described later). The insulating portion 25 is provided among the plurality of pillars 30 in the X direction and the Y direction.

<1.3 Pillar>

Next, the pillar 30 will be described.

As illustrated in FIG. 2, the plurality of pillars 30 are arranged in a matrix in the X direction and the Y direction. Each pillar 30 extends in the Z direction through the stacked body 20 and the insulating portion 25 (see FIG. 1). The plurality of pillars 30 include, for example, a plurality of pillars 30A in a first row, a plurality of second pillars 30B in a second row, a plurality of third pillars 30C in a third row, and a plurality of fourth pillars 30D in a fourth row. In FIG. 2, for convenience of explanation, the outer shape of each pillar 30 is illustrated as a rectangular parallelepiped shape. However, the pillar 30 may be columnar or conical.

The plurality of pillars 30A in the first row are provided between the source line SL1 and the drain line DL1 in the Y direction. The plurality of pillars 30A in the first row are arranged in the X direction at intervals from each other. The plurality of pillars 30B in the second row are provided between the drain line DL1 and the source line SL2 in the Y direction. The plurality of pillars 30B in the second row are arranged in the X direction at intervals from each other. The plurality of pillars 30B in the second row are disposed at positions displaced in the +X direction with respect to the plurality of pillars 30A in the first row in the X direction. For example, in the plurality of pillars 30A in the first row and the plurality of pillars 30B in the second row, the pillars 30A in the first row and the pillars 30B in the second row are alternately positioned with respect to the X direction.

The plurality of pillars 30C in the third row are provided between the source line SL2 and the drain line DL2 in the Y direction. The plurality of pillars 30C in the third row are arranged in the X direction at intervals from each other. For example, the plurality of pillars 30A in the first row and the plurality of pillars 30C in the third row are located at the same position in the X direction. The plurality of pillars 30D in the fourth row are provided between the drain line DL2 and the source line SL3 in the Y direction. The plurality of pillars 30D in the fourth row are arranged in the X direction at intervals from each other. The plurality of pillars 30D in the fourth row are disposed at positions displaced in the +X direction with respect to the plurality of pillars 30C in the third row in the X direction. For example, in the plurality of pillars 30C in the third row and the plurality of pillars 30D in the fourth row, the pillars 30C in the third row and the pillars 30D in the fourth row are alternately positioned with respect to the X direction. For example, the plurality of pillars 30B in the second row and the plurality of pillars 30D in the fourth row are located at the same position in the X direction. In other words, the plurality of pillars 30B in the second row are provided between the plurality of pillars 30A in the first row and the plurality of pillars 30C in the third row in the Y direction, and are provided at different positions from the plurality of pillars 30A in the first row and the plurality of pillars 30C in the third row in the X direction.

In at least one embodiment, each pillar 30 includes a gate wiring 31, a block insulating film 32, a memory film 33, a tunnel insulating film 34, a semiconductor layer 35, and an upper insulating portion 36 (see FIG. 1).

The gate wiring 31 extends in the Z direction so as to extend over the entire length (total height) of the pillar 30 in the Z direction. The gate wiring 31 forms the core of the pillar 30 (the central portion when viewed in the Z direction). The gate wiring 31 is a conductive portion that penetrates the stacked body 20 and the insulating portion 25 in the Z direction. The gate wiring 31 is formed of a conductive material such as polysilicon (poly-Si) doped with impurities. In the present embodiment, the phrase "gate wiring" means a wiring to which a voltage is applied during a data write operation or a data read operation. According to another definition, the gate wiring 31 means a wiring to which a voltage is applied to change the charge state of a charge storage unit 40 (to be described later). The gate wiring 31 is connected to the bit line BL via a contact 80 (to be described later). The gate wiring 31 is an example of a "fourth wiring".

The block insulating film 32 is formed in an annular shape surrounding the gate wiring 31 when viewed in the Z direction. The block insulating film 32 is provided between the gate wiring 31 and the memory film 33 (to be described later). The block insulating film 32 is an insulating film that prevents back tunneling. Back tunneling is a phenomenon in which electric charge returns from the gate wiring 31 to the memory film 33 (charge storage unit 40). The block insulating film 32 extends in the Z direction so as to cover most of the pillar 30 in the Z direction. The block insulating film 32 is, for example, a stacked structure film on which a silicon oxide film, a metal oxide film, and a plurality of insulating films are stacked. An example of a metal oxide is an aluminum oxide ($Al_2O_3$). The block insulating film 32 may contain a high dielectric constant material (high-k material) such as silicon nitride (SiN) or hafnium oxide (HfO).

The memory film 33 is formed in an annular shape surrounding the block insulating film 32 when viewed in the Z direction. In other words, the memory film 33 is formed in an annular shape surrounding the gate wiring 31 when viewed in the Z direction. The memory film 33 is provided between the block insulating film 32 and the tunnel insulating film 34 (to be described later). In at least one embodiment, the memory film 33 extends in the Z direction so as to cover most of the pillars 30. In at least one embodiment, the memory film 33 is a charge trap film capable of accumulating electric charges in crystal defects. The charge trap film is formed of, for example, silicon nitride ($Si_3N_4$).

In at least one embodiment, the memory film 33 includes a plurality of charge storage units (charge storages) 40 (see FIG. 1). Each charge storage unit 40 is a region located at the same height as the source line SL and the drain line DL in the memory film 33. In other words, the charge storage unit 40 is a region of the memory film 33 that is aligned with one of the first to fourth functional layers 21A to 21D in the Y direction. The charge storage unit 40 is a storage unit that may store data by storing a state of electric charge (e.g., the amount of electric charge or the direction of polarization). The charge storage unit 40 changes the state of electric charge (e.g., the amount of charge or the direction of polarization) when a voltage satisfying a predetermined condition is applied to the gate wiring 31. As a result, the charge storage unit 40 stores the data in a non-volatile manner. For example, the charge storage unit 40 composed of a charge trap film stores the data in a non-volatile manner according to the amount of electric charge.

As illustrated in FIG. 2, the charge storage unit 40 includes a first portion 40a and a second portion 40b. The first portion 40a of the charge storage unit 40 is located on the +X direction side with respect to the gate wiring 31. The first portion 40a of the charge storage unit 40 is located between the gate wiring 31 and a first portion 50a of the channel portion 50 (to be described later). Meanwhile, the second portion 40b of the charge storage unit 40 is located on the −X direction side with respect to the gate wiring 31. The second portion 40b of the charge storage unit 40 is located between the gate wiring 31 and a second portion 50b of the channel portion 50 (to be described later).

The tunnel insulating film 34 is formed in an annular shape surrounding the memory film 33 when viewed in the Z direction. In other words, the block insulating film 32 is provided between the memory film 33 and the semiconductor layer 35 (to be described later). The tunnel insulating film 34 is a potential barrier between the charge storage unit 40 and the semiconductor layer 35. The tunnel insulating film 34 extends in the Z direction so as to cover most of the pillars 30. The tunnel insulating film 34 is formed of silicon oxide ($SiO_2$) or an insulating material containing silicon oxide ($SiO_2$) and silicon nitride (SiN).

The semiconductor layer 35 is formed in an annular shape surrounding the tunnel insulating film 34 when viewed in the Z direction. In other words, the semiconductor layer 35 is provided between the memory film 33 (charge storage unit 40) and the insulating portion 23, between the memory film 33 (charge storage unit 40) and the source line SL, and between the memory film 33 (charge storage unit) and the drain line DL. In at least one embodiment, the semiconductor layer 35 extends in the Z direction so as to cover most of the pillars 30. That is, the semiconductor layer 35 extends in the Z direction along the gate wiring 31. The semiconductor layer 35 is made of a semiconductor material such as amorphous silicon (a-Si) or polysilicon (poly-Si). The semiconductor layer 35 may be doped with impurities. The impurities contained in the semiconductor layer 35 are, for example, anyone selected from the group consisting of carbon, phosphorus, boron, and germanium.

In at least one embodiment, the semiconductor layer 35 includes a plurality of channel portions 50 (see FIG. 1). Each channel portion 50 is a region located at the same height as the source line SL and the drain line DL in the semiconductor layer 35. In other words, the channel portion 50 is a region in the semiconductor layer 35 that is aligned with one of the first to fourth functional layers 21A to 21D in the Y direction. The channel portion 50 includes a semiconductor and is in contact with the source line SL and the drain line DL. In at least one embodiment, the phrase "channel portion" means a region in which a channel is formed when a voltage is applied to the gate wiring 31. In at least one embodiment, the channel portion 50 is a region in which a current (channel current) flows from the drain line DL to the source line SL when a predetermined voltage is applied to the gate wiring 31. The channel portion 50 is an example of the "third wiring".

In at least one embodiment, each channel portion 50 includes a first portion 50a and a second portion 50b divided on both sides of the gate wiring 31 in the X direction. The first portion 50a is located on the +X direction side with respect to the gate wiring 31. The first portion 50a extends in the Y direction and is in contact with the source line SL and the drain line DL. The first portion 50a is a part of the channel portion 50 that is aligned with the first portion 40a of the charge storage unit 40 and the gate wiring 31 in the X direction. The second portion 50b is located on the opposite side to the first portion 50a with respect to the gate wiring 31 in the X direction. That is, the second portion 50b is located on the −X direction side with respect to the gate wiring 31. The second portion 50b extends in the Y direction and is in contact with the source line SL and the drain line DL. The second portion 50b is a part of the channel portion 50 that is aligned with the second portion 40b of the charge storage unit 40 and the gate wiring 31 in the X direction.

In at least one embodiment, the MANOS (Metal-Al-Nitride-Oxide-Silicon) type memory cell MC is formed by the gate wiring 31, the block insulating film 32, the charge storage unit 40, the tunnel insulating film 34, and the channel portion 50 described above. As illustrated in FIGS. and 2, the plurality of memory cells MC are three-dimensionally disposed at intervals in the X direction, the Y direction, and the Z direction.

Next, other structures of the stacked body 20 and the pillar 30 will be described.

As illustrated in FIG. 1, the gate wiring 31 has an enlarged diameter portion 31a that is connected to a select transistor ST (to be described later) at the upper end of the pillar 30. The enlarged diameter portion 31a projects in the X direction and the Y direction, and the size in the X direction and the Y direction is enlarged as compared with the other portions of the gate wiring 31. The upper end of the semiconductor layer 35 is located on the −Z direction side with respect to the enlarged diameter portion 31a of the gate wiring 31. An upper insulating portion 36 is provided on the semiconductor layer 35. The upper insulating portion 36 is provided between the semiconductor layer 35 and the enlarged diameter portion 31a of the gate wiring 31, and electrically insulates the semiconductor layer 35 and the gate wiring 31.

As illustrated in FIG. 2, the stacked body 20 includes an insulating portion STH locally provided in the X direction and the Y direction. The insulating portion STH extends in the Z direction and penetrates the stacked body 20 to reach the semiconductor layer 12. The insulating portion STH is formed by filling the holes provided in the stacked body 20 with an insulating material in the manufacturing process (replacement process) of the semiconductor storage device 1A (to be described later). This content will be described in detail later.

<1.4 Upper Structure of Semiconductor Storage Device>

Next, the upper structure of the semiconductor storage device 1A will be described.

As illustrated in FIG. 1, an upper structure 70 is provided on the insulating portion 25. The upper structure 70 includes, for example, a plurality of select transistors ST, a plurality of select gate lines SGL, and an insulating portion 75.

The select transistor ST is a vertical transistor located between the contact 80 (to be described later) and the gate wiring 31 of the pillar 30 in the Z direction. The select transistor ST is a switching element that switches the electrical connection state between the contact 80 and the gate wiring 31 of the pillar 30. The plurality of select transistors ST are arranged in a matrix at positions corresponding to the pillars 30 in the X direction and the Y direction. An insulating portion 75 (see FIG. 1) is provided among the plurality of select transistors ST. Each select transistor ST includes, for example, a semiconductor layer 71, an insulating layer 72, a core insulating portion 73, and a gate electrode 74.

The semiconductor layer 71 extends in the Z direction and is in contact with the contact 80 and the gate wiring 31 of the pillar 30. The semiconductor layer 71 is formed of a semiconductor material such as amorphous silicon (a-Si) or polysilicon (poly-Si). The semiconductor layer 71 may be doped with impurities. The impurities contained in the semiconductor layer 71 are, for example, anyone selected from the group consisting of carbon, phosphorus, boron, and germanium. When a predetermined voltage is applied to the gate electrode 74 (to be described later), the semiconductor layer 71 forms a channel to electrically connect the contact 80 and the gate wiring 31 of the pillar 30. In the present embodiment, the semiconductor layer 71 is annular when viewed in the Z direction.

The semiconductor layer 71 has an enlarged diameter portion 71a connected to the contact 80 (to be described later) at the upper end of the select transistor ST. The enlarged diameter portion 71a projects in the X direction and the Y direction, and the size in the X direction and the Y direction is enlarged as compared with the other portions of the semiconductor layer 71.

The insulating layer 72 is formed in an annular shape surrounding the semiconductor layer 71 when viewed in the Z direction. At least a part of the insulating layer 72 is located between the semiconductor layer 71 and the gate electrode 74. The insulating layer 72 is formed of an insulating material such as silicon oxide ($SiO_2$). The core insulating portion 73 is provided inside the annular semiconductor layer 71. The core insulating portion 73 is formed of an insulating material such as silicon oxide ($SiO_2$).

The gate electrode 74 is aligned with the semiconductor layer 71 in the Y direction. In at least one embodiment, the select transistor ST includes two gate electrodes 74. The two gate electrodes 74 are disposed at different positions in the Z direction. The gate electrode 74 is provided integrally with, for example, the select gate line SGL (to be described later). In other words, the part of the select gate line SGL that is aligned with the semiconductor layer 35 in the Y direction functions as the gate electrode 74.

Figure 3:
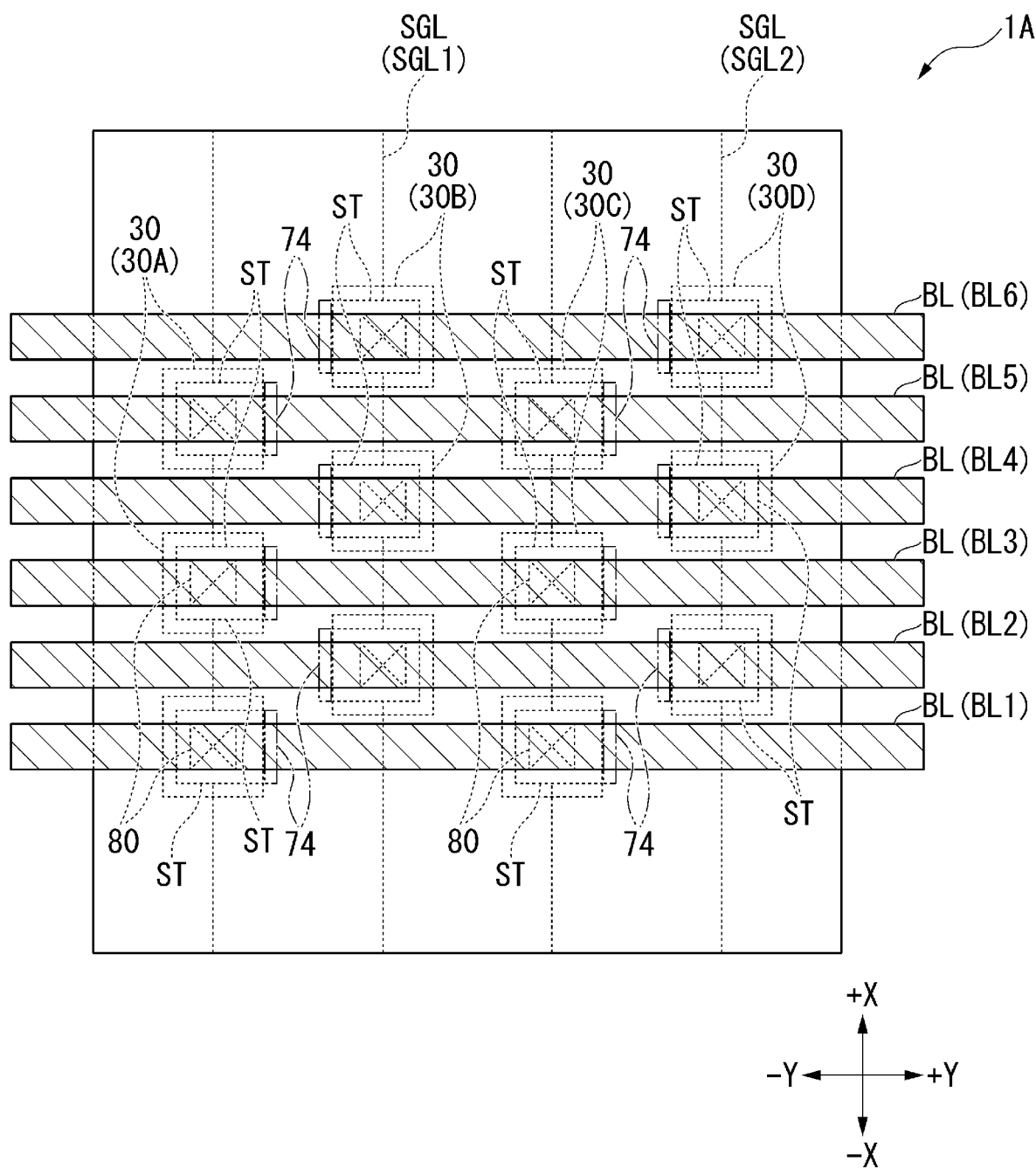
FIG. 3 is a cross-sectional view taken along line F3-F3 of the semiconductor storage device illustrated in FIG. 1.

FIG. 3 is a cross-sectional view taken along line F3-F3 of the semiconductor storage device 1A illustrated in FIG. 1. The plurality of select gate lines SGL (e.g., select gate lines SGL1 and SGL2) extend in the X direction, respectively. Each select gate line SGL is commonly provided for a plurality of select transistors ST.

For example, the first select gate line SGL1 is located between a plurality of select transistors ST corresponding to a plurality of pillars 30A in the first row and a plurality of select transistors ST corresponding to a plurality of pillars 30B in the second row in the Y direction. The first select gate line SGL1 is connected to a gate electrode 74 of a plurality of select transistors ST corresponding to a plurality of pillars 30A in the first row and a gate electrode 74 of a plurality of select transistors ST corresponding to a plurality of pillars 30B in the second row in the Y direction. When a voltage is applied to the first select gate line SGL1, the plurality of select transistors ST corresponding to the plurality of pillars 30A in the first row and the plurality of select transistors ST corresponding to the plurality of pillars 30B in the second row are in a conductive state.

The second select gate line SGL2 is located between the plurality of select transistors ST corresponding to the plurality of pillars 30C in the third row and the plurality of select transistors ST corresponding to the plurality of pillars 30D in the fourth row in the Y direction. The second select gate line SGL2 is connected to the gate electrode 74 of the plurality of select transistors ST corresponding to the plurality of pillars 30C in the third row and the gate electrode 74 of the plurality of select transistors ST corresponding to the plurality of pillars 30D in the fourth row in the Y direction. When a voltage is applied to the second select gate line SGL2, the plurality of select transistors ST corresponding to the plurality of pillars 30C in the third row and the plurality of select transistors ST corresponding to the plurality of pillars 30D in the fourth row are in a conductive state.

Each contact 80 is provided between the semiconductor layer 71 of the select transistor ST and the bit line BL (to be described later) in the Z direction. The contact 80 connects the semiconductor layer 71 of the select transistor ST and the bit line BL. The contact 80 is formed of a conductive material such as tungsten (W).

The plurality of bit lines BL extend in the Y direction. The plurality of bit lines BL include, for example, bit lines BL1 to BL6. Each bit line BL is commonly provided for a plurality of pillars 30. For example, the bit line BL1 is provided above one pillar 30A in the first row and one pillar 30C in the third row, and is connected to the contact 80 corresponding to the pillar 30A and the contact 80 corresponding to the pillar 30C. When a voltage is applied to the bit line BL1, a voltage is applied to the contact 80 corresponding to one pillar 30A and the contact 80 corresponding to one pillar 30C.

Similarly, the bit lines BL2 to BL6 are commonly provided for each of the two pillars 30. As for the description of the bit lines BL2, BL4, and BL6, the "pillars 30A and 30C" may be replaced with "pillars 30B and 30D" in the above description of the bit line BL1. Meanwhile, as for the description of the bit lines BL3 and BL5, the "pillars 30A and 30C" may be read as "pillars 30A and 30C" as it is in the above description of the bit line BL1. The bit line BL1 is an example of a "first bit line". The bit line BL3 is an example of a "second bit line". One select transistor ST corresponding to the bit line BL1 is an example of a "first select transistor". Another select transistor ST corresponding to the bit line BL1 is an example of a "third select transistor". One select transistor ST corresponding to the bit line BL3 is an example of a "second select transistor".

The configuration of the semiconductor storage device 1A has been described above. The charge storage unit 40 and the channel portion 50 in the pillar 30A at a height corresponding to the first functional layer 21A are examples of a "first charge storage unit" and a "first channel portion". The gate wiring 31 in the pillar 30A is an example of a "first gate wiring". The charge storage unit 40 and the channel portion 50 in another pillar 30A at a height corresponding to the first functional layer 21A are examples of a "second charge storage unit" and a "second channel portion". The gate wiring 31 in the other pillar 30A is an example of a "second gate wiring".

The charge storage unit 40 and the channel portion 50 in the pillar 30B at a height corresponding to the first functional layer 21A are examples of a "third charge storage unit" and a "third channel portion". The gate wiring 31 in the pillar 30B is an example of a "third gate wiring". The charge storage unit 40 and the channel portion 50 in another pillar 30B at a height corresponding to the first functional layer 21A are examples of a "fourth charge storage unit" and a "fourth channel portion". The gate wiring 31 in the other pillar 30B is an example of a "fourth gate wiring".

The charge storage unit 40 and the channel portion 50 in the pillar 30A at a height corresponding to the second functional layer 21B are examples of a "fifth charge storage unit" and a "fifth channel portion".

<2. Operation of Semiconductor Storage Device>

Next, the operation of the semiconductor storage device 1A will be described.

Figure 4:
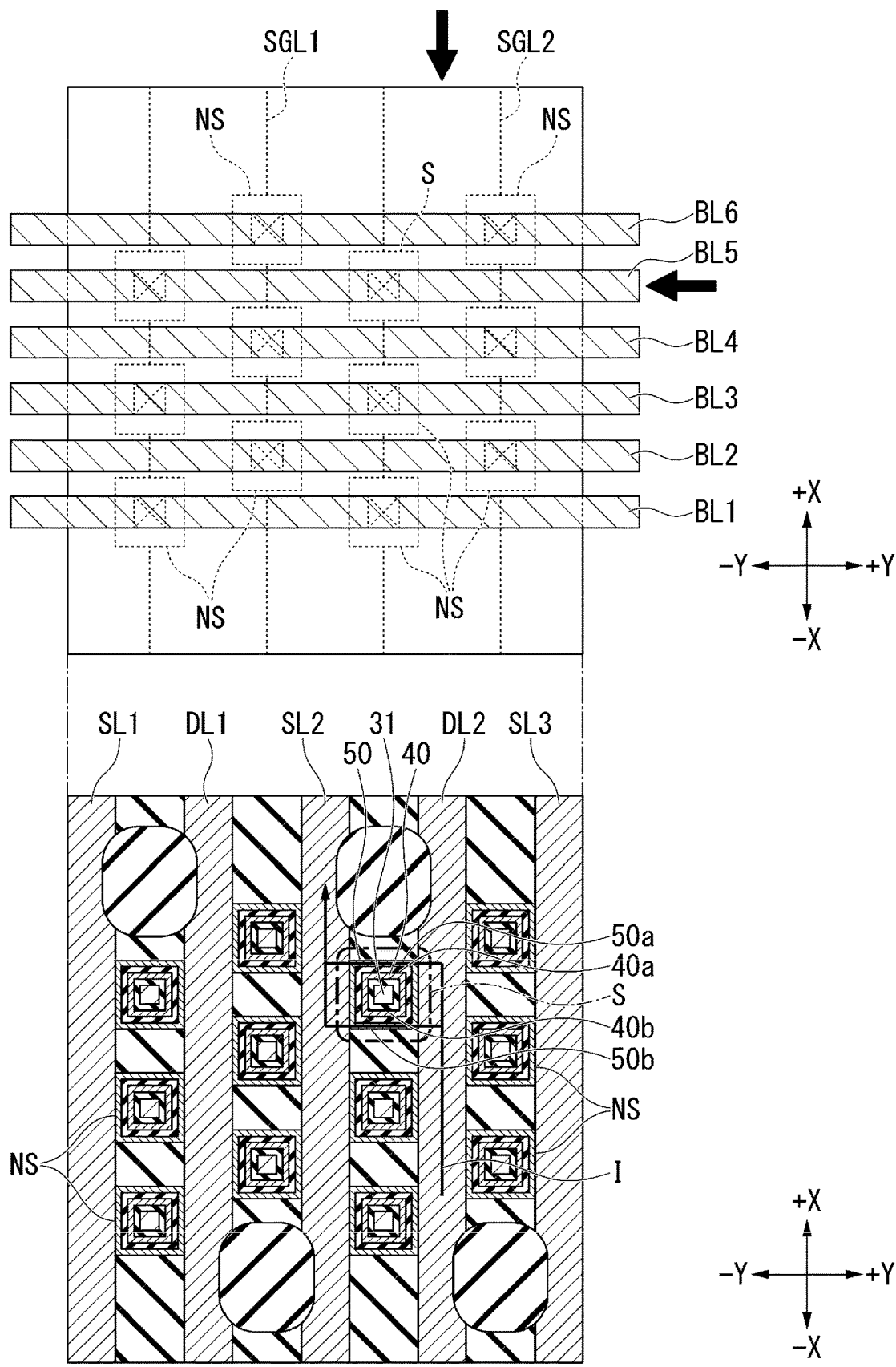
FIG. 4 is a cross-sectional view illustrating the operation of the semiconductor storage device of the first embodiment.

FIG. 4 is a cross-sectional view illustrating the operation of the semiconductor storage device 1A. In the semiconductor storage device 1A, any memory cell MC may be selected as a data write or data read target by combining the select gate line SGL and the bit line BL.

The example illustrated in FIG. 4 represents a case where a voltage is applied to the select gate line SGL2 and a voltage is applied to the bit line BL5. In this case, a voltage is applied to the gate wiring 31 of one pillar 30 (hereinafter, referred to as a "select pillar S") corresponding to the intersection of the select gate line SGL2 and the bit line BL5. As a result, a channel is formed in the channel portion 50 of the select pillar S, and a current I flows from the drain line DL2 adjacent to the select pillar S to the source line SL2. For example, the current I flows separately from the first portion 50a and the second portion 50b of the channel portion 50. Meanwhile, no channel is formed in the channel portion 50 of the pillar 30 (hereinafter, referred to as a "non-select pillar NS") other than the select pillar S. As a result, the electrical insulation state between the drain line DL and the source line SL adjacent to the non-select pillar NS is maintained.

The semiconductor storage device 1A of at least one embodiment uses the above operations to perform a data write operation and a data read operation on the memory cell MC. For example, in the write operation, the peripheral circuit of the semiconductor storage device 1A selects only the pillar 30 corresponding to the memory cell MC to be written as the select pillar S. Then, the peripheral circuit applies a programming pulse to the gate wiring 31 of the select pillar S via the bit line BL. The programming pulse is a pulse in which the voltage gradually increases with each cycle. As a result, a current flows through the channel portion 50 corresponding to the memory cell MC to be written, and the electric charges are accumulated in the charge storage unit 40 of the memory cell MC to be written. As a result, the threshold voltage of the charge storage unit 40 rises. The sense amplifier circuit SA determines whether the threshold voltage of the memory cell MC to be written reaches a voltage preset according to the data to be written (hereinafter, referred to as "write data") for each cycle of the programming pulse. The peripheral circuit continues to apply the programming pulse until the threshold voltage of the memory cell MC reaches the voltage corresponding to the write data according to the determination result by the sense amplifier circuit SA. In the write operation, a predetermined voltage is applied to the drain line DL of the functional layer 21 that does not include the memory cell MC to be written. As a result, no current flows through the channel portion 50 corresponding to the memory cell MC other than the write target.

In the read operation, the sense amplifier circuit SA precharges a power supply potential Vcc to the drain line DL adjacent to the memory cell MC to be read. The peripheral circuit selects the pillar 30 corresponding to the memory cell MC to be read as the select pillar S. Then, the peripheral circuit sequentially applies a plurality of types of determination potentials (threshold determination voltages) that determines the threshold voltage of the memory cell MC to the gate wiring 31 of the select pillar S. The sense amplifier circuit SA determines the data stored in the memory cell MC to be read by detecting which determination voltage is applied when the electric charges accumulated by the precharge flow out to the source line SL.

<3. Manufacturing Method of Semiconductor Storage Device>

Next, a method of manufacturing the semiconductor storage device 1A will be described. FIGS. 5 to 8 are cross-sectional views illustrating a method of manufacturing the semiconductor storage device 1A. The materials described below are merely examples, and do not limit the contents of the embodiments.

Figure 5:
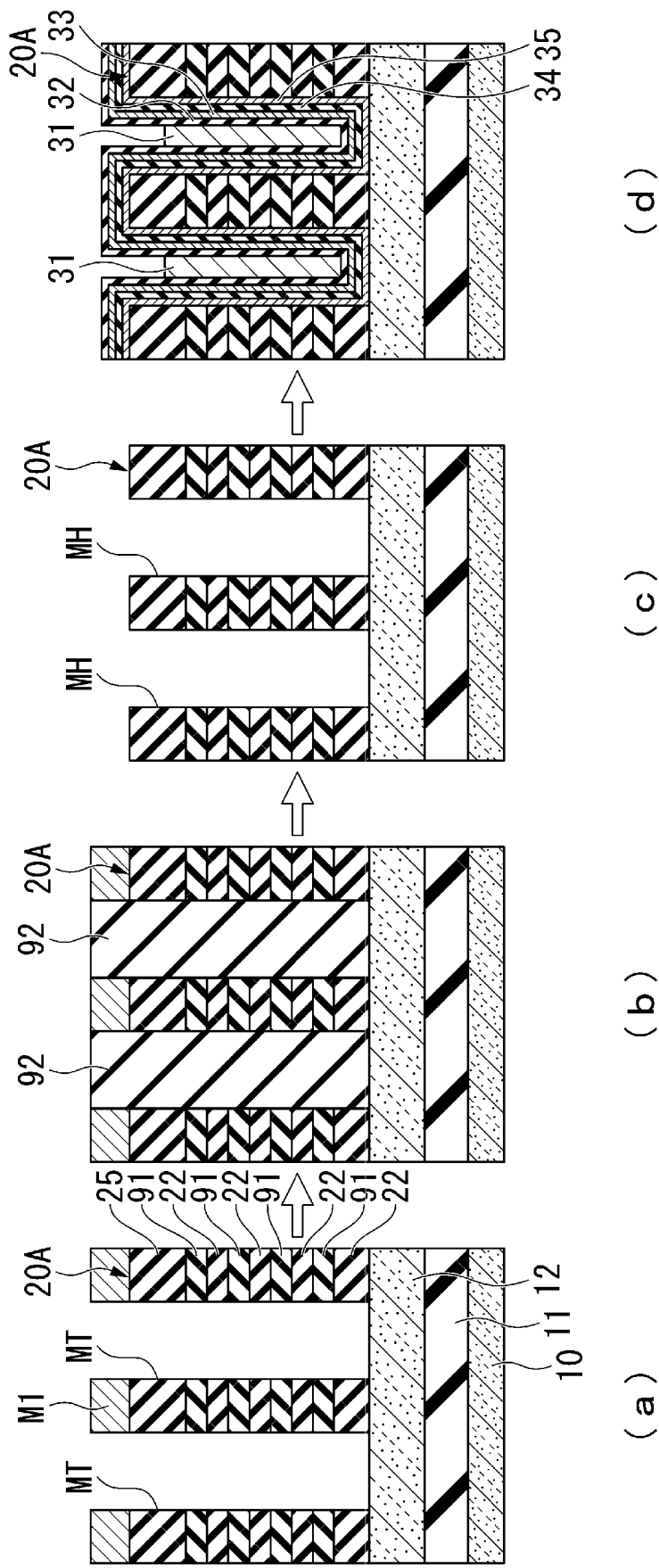
FIG. 5 is a cross-sectional view illustrating a method of manufacturing the semiconductor storage device of the first embodiment.

As illustrated in part (a) of FIG. 5, the insulating layer 11 and the semiconductor layer 12 are formed on the silicon substrate 10. Next, the insulating layer 22 made of silicon oxide ($SiO_2$) and an insulating layer 91 made of silicon nitride (SiN) are alternately stacked on the semiconductor layer 12. As a result, an intermediate stacked body 20A is formed. The insulating layer 91 is a sacrificial layer that is replaced with the functional layer 21 in a later process. Next, the insulating portion 25 is provided on the intermediate stacked body 20A. Next, a mask M1 is provided on the intermediate stacked body 20A and the insulating portion 25. Next, the memory trench MT is provided by etching using the mask M1. The memory trench MT is a groove which extends in the Z direction and extends in the X direction. In at least one embodiment, the semiconductor layer 12 prevents the memory trench MT from extending excessively deeply.

Next, as illustrated in part (b) of FIG. 5, the memory trench MT is filled with an insulating material 92 made of silicon oxide ($SiO_2$). The insulating material 92 forms an insulating portion 23 (see FIG. 2) located among the plurality of pillars 30 in a later process.

Next, as illustrated in part (c) of FIG. 5, a memory hole MH is provided by etching at a position where the pillar 30 is formed in a later process. The memory hole MH is a hole extending in the Z direction.

Next, as illustrated in part (d) of FIG. 5, the material of the semiconductor layer 35, the material of the tunnel insulating film 34, the material of the memory film 33, and the material of the block insulating film 32 are sequentially supplied to the inner surface of the memory hole MH. As a result, the semiconductor layer 35, the tunnel insulating film 34, the memory film 33, and the block insulating film 32 are formed. Next, polysilicon (poly-Si) is supplied to the inside of the block insulating film 32, and impurities are doped. As a result, the gate wiring 31 is formed. Next, the upper end of the gate wiring 31 is removed by etch back.

Figure 6:
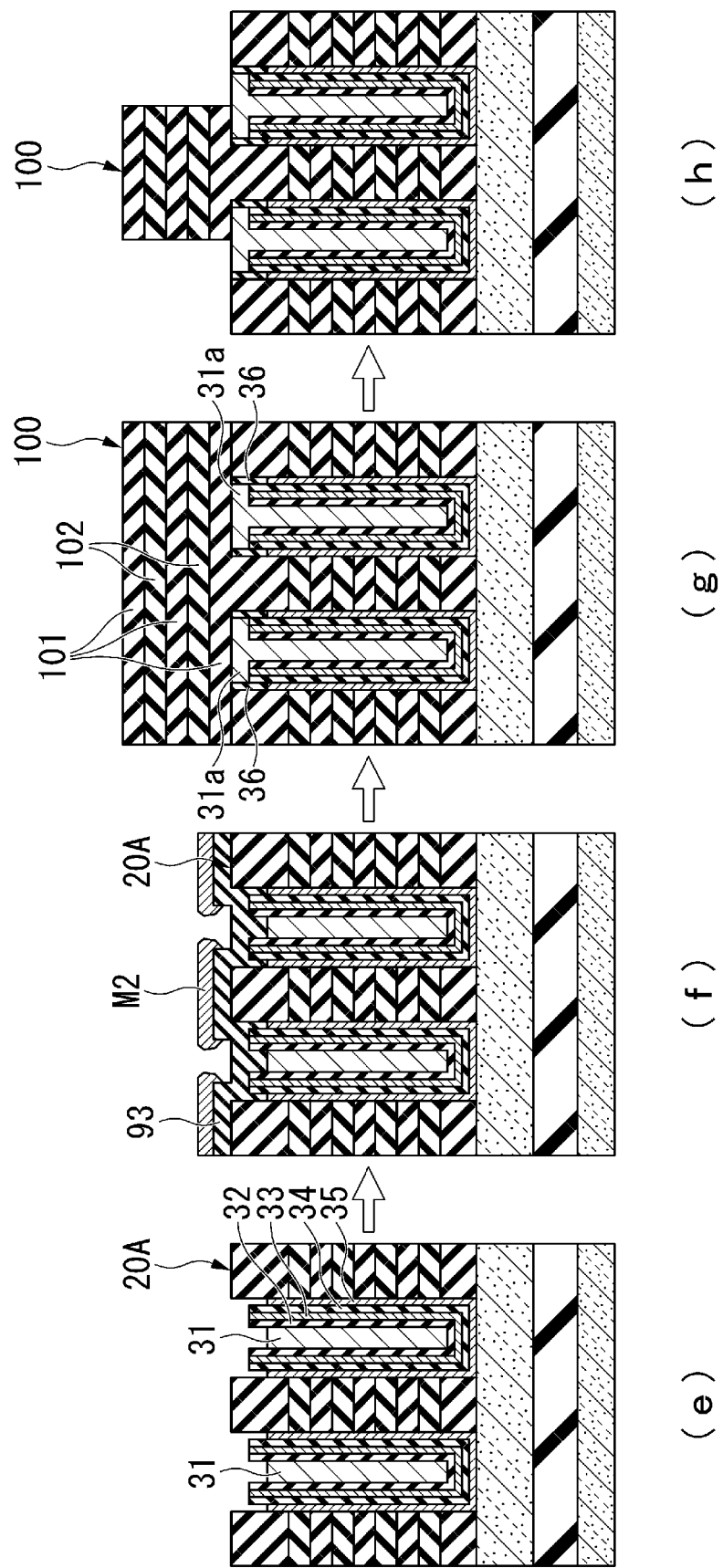
FIG. 6 is a cross-sectional view illustrating a method of manufacturing the semiconductor storage device of the first embodiment.

Next, as illustrated in part (e) of FIG. 6, unnecessary portions of the semiconductor layer 35, the tunnel insulating film 34, the memory film 33, and the block insulating film 32 are removed by etch back, for example. Next, as illustrated in part (f) of FIG. 6, silicon nitride (SiN) is supplied on the semiconductor layer 35, the tunnel insulating film 34, the memory film 33, the block insulating film 32, and the gate wiring 31, and an upper insulating portion 93 is formed. Next, a mask M2 is provided to remove the central portion of the upper insulating portion 93. Next, the central portion of the upper insulating portion 93 is removed by etching using the mask M2. As a result, the upper insulating portion 36 is formed.

Next, as illustrated in part (g) of FIG. 6, amorphous silicon (a-Si) is supplied and the enlarged diameter portion 31a of the gate wiring 31 is formed. Next, an insulating layer 101 made of silicon oxide ($SiO_2$) and an insulating layer 102 made of silicon nitride (SiN) are alternately stacked. As a result, an intermediate stacked body 100 is formed. The insulating layer 101 forms an insulating portion 75 in a later process. The insulating layer 102 is a sacrificial layer that is replaced with the gate electrode 74 of the select transistor ST and the select gate line SGL in a later process. Next, as illustrated in part (h) of FIG. 6, unnecessary portions of the intermediate stacked body 100 are removed.

Figure 7:
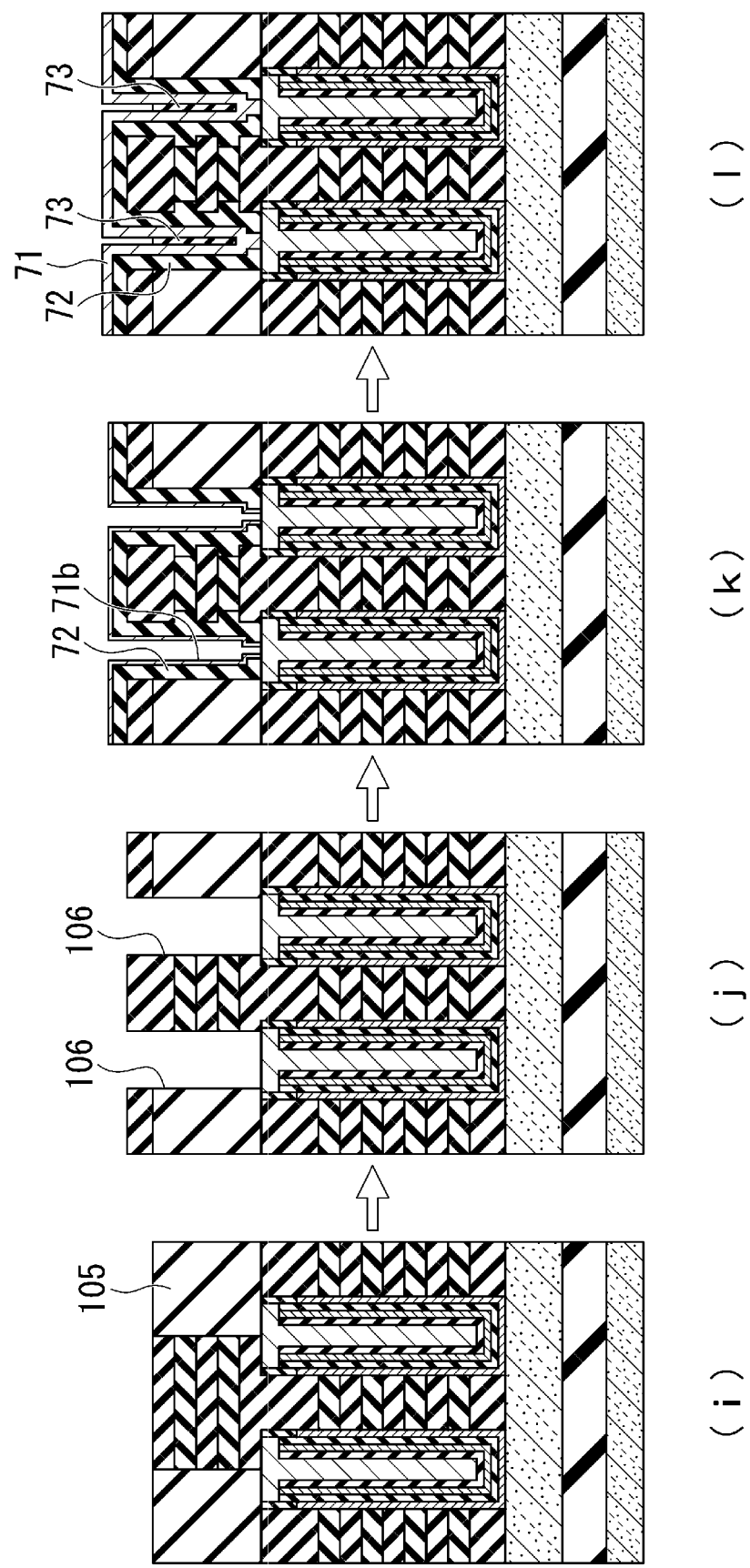
FIG. 7 is a cross-sectional view illustrating a method of manufacturing the semiconductor storage device of the first embodiment.

Next, as illustrated in part (i) of FIG. 7, the insulating material made of silicon oxide (SiO$_2$) is supplied to the region where the unnecessary portions of the intermediate stacked body 100 are removed, and an insulating portion 105 is formed. Next, as illustrated in part (j) of FIG. 7, a hole 106 in which the semiconductor layer 71, the insulating layer 72, and the core insulating portion 73 of the select transistor ST are provided is formed in the intermediate stacked body 100 and the insulating portion 105.

Next, as illustrated in part (k) of FIG. 7, the material of the insulating layer 72 of the select transistor ST and the material of the semiconductor layer 71 are supplied to the inner peripheral surface of the hole 106. As a result, the insulating layer 72 and a semiconductor cover layer 71b are formed. The semiconductor cover layer 71b is a protective layer that protects the insulating layer 72. Next, a mask (not illustrated) is used to provide holes in the bottoms of the insulating layer 72 and the semiconductor cover layer 71b.

Next, as illustrated in part (1) of FIG. 7, the material of the semiconductor layer 71 and the material of the core insulating portion 73 are supplied to the inner surface of the hole 106, and the semiconductor layer 71 and the core insulating portion 73 are formed. Next, as illustrated in part (m) of FIG. 8, unnecessary portions of the insulating layer 72 and the semiconductor layer 71 are removed. Next, as illustrated in part (n) of FIG. 8, the upper end of the insulating layer 72 is removed, and the enlarged diameter portion 71a of the semiconductor layer 71 is formed.

Figure 8:
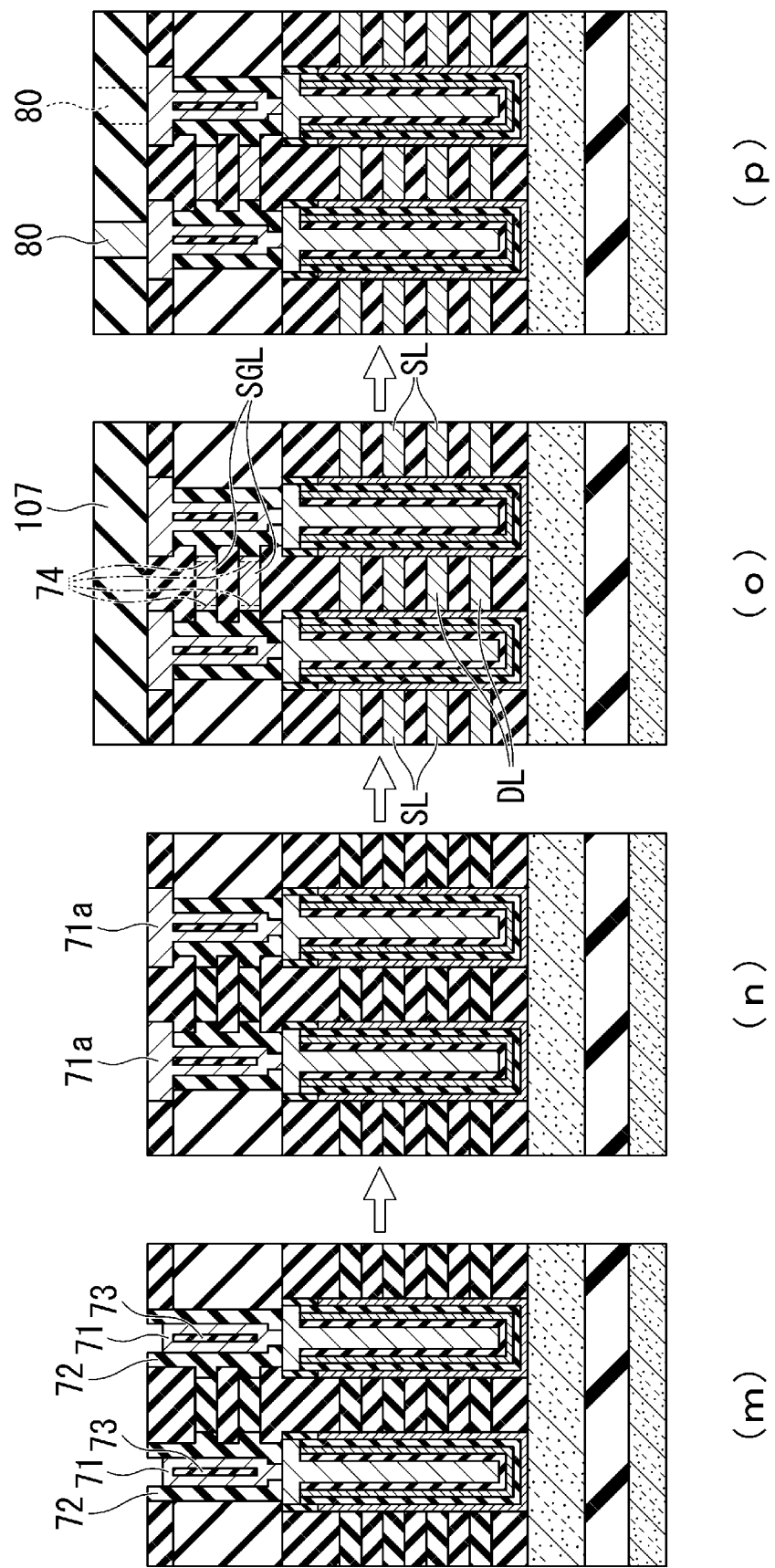
FIG. 8 is a cross-sectional view illustrating a method of manufacturing the semiconductor storage device of the first embodiment.

Next, as illustrated in part (1) of FIG. 8, an insulating portion 107 is provided on the select transistor ST. Next, holes (not illustrated) penetrating the intermediate stacked body 20A, the insulating portion 25, and the intermediate stacked body 100 in the Z direction are provided, and silicon nitride (SiN) forming the insulating layers 91 and 102 is removed through the holes. Next, a conductive material made of tungsten (W) is supplied to the space from which the insulating layers 91 and 102 have been removed, and the source line SL, the drain line DL, the gate electrode 74, and the select gate line SGL are formed. Next, as illustrated in part (o) of FIG. 8, the contact 80 is provided in the insulating portion 107. Thereafter, the bit line BL is provided. As a result, the semiconductor storage device 1A is manufactured.

<4. Advantages>

As a comparative example, a semiconductor storage device is considered which has a stacked body in which insulating films and word lines are alternately stacked in the thickness direction of the substrate, and a channel portion that penetrates the stacked body in the thickness direction of the substrate. In such a semiconductor storage device, the length of the channel portion becomes longer as the number of layers increases. As a result, the read current decreases and the noise during the read operation increases. Therefore, the read time required for reading data may increase.

Further, in the semiconductor storage device of the above comparative example, a sequential read is fast, while the read by a random read takes a longer time. The sequential read means read in word line units. Meanwhile, the random read means an operation of reading data from a plurality of memory cells, not from a specific wiring unit.

The semiconductor storage device of at least one embodiment includes a source line SL and a drain line DL extending in a direction along the surface of the silicon substrate 10, a channel portion 50 provided between the source line SL and the drain line DL, a gate wiring 31 extending in the thickness direction of the silicon substrate 10 and aligned with the channel portion 50, and a charge storage unit 40 provided between the channel portion 50 and the gate wiring 31. According to such a configuration, the channel portion 50 is formed in the direction parallel to the surface of the silicon substrate 10, and the length of the channel portion 50 is shortened. As a result, the decrease in read current and the noise during the read operation are prevented. Therefore, the read time may be shortened.

In the present embodiment, the channel portion 50 includes a first portion 50a and a second portion 50b divided on both sides of the gate wiring 31. The charge storage unit 40 includes a first portion 40a located between the first portion 50a of the channel portion 50 and the gate wiring 31, and a second portion 40b located between the second portion 50b of the channel portion 50 and the gate wiring 31. According to such a configuration, two paths through which the channel current flows may be secured for one gate wiring 31, so that data may be written and read more stably.

As illustrated in FIG. 2, the semiconductor storage device 1A includes a channel portion 50 and a charge storage unit 40 in one pillar 30A, and a channel portion 50 and a charge storage unit 40 in another pillar 30A. These channel portions 50 are connected in parallel to the same source line SL and drain line DL. According to such a configuration, even when a random read is performed, the memory cell MC may be accessed in a short read time. This enables reading with low latency.

Second Embodiment

Next, a second embodiment will be described. The second embodiment is different from the first embodiment in that the semiconductor layer 35 is not located in the pillar 30B and the semiconductor layer 35 is divided into several parts in the Z direction. The configuration other than that described below is the same as the configuration of the first embodiment.

Figure 9:
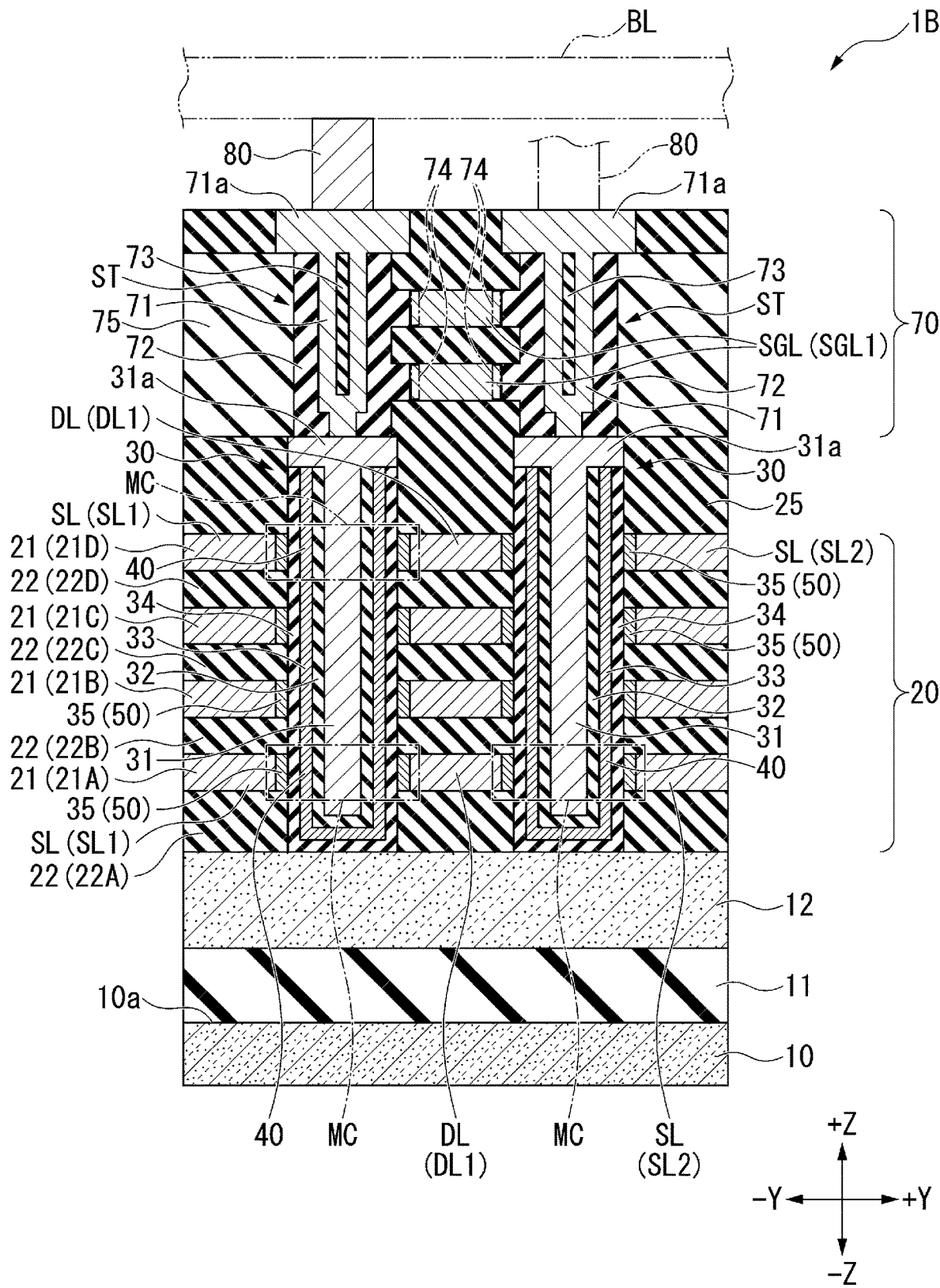
FIG. 9 is a cross-sectional view illustrating a semiconductor storage device of a second embodiment.

FIG. 9 is a cross-sectional view illustrating the semiconductor storage device 1B of the second embodiment. In at least one embodiment, the pillar 30B includes a gate wiring 31, a block insulating film 32, a memory film 33, and a tunnel insulating film 34, but does not include the semiconductor layer 35. In at least one embodiment, the semiconductor layer 35 is provided in a region aligned with the source line SL and the drain line DL in the Y direction.

In other words, a part of an insulating layer 22B is provided between the channel portion 50 corresponding to the first functional layer 21A and the channel portion 50 corresponding to the second functional layer 21B. Similarly, a part of an insulating layer 22C is provided between the channel portion 50 corresponding to the second functional layer 21B and the channel portion 50 corresponding to the third functional layer 21C. A part of an insulating layer 22D is provided between the channel portion 50 corresponding to the third functional layer 21C and the channel portion 50 corresponding to the fourth functional layer 21D.

Figure 10:
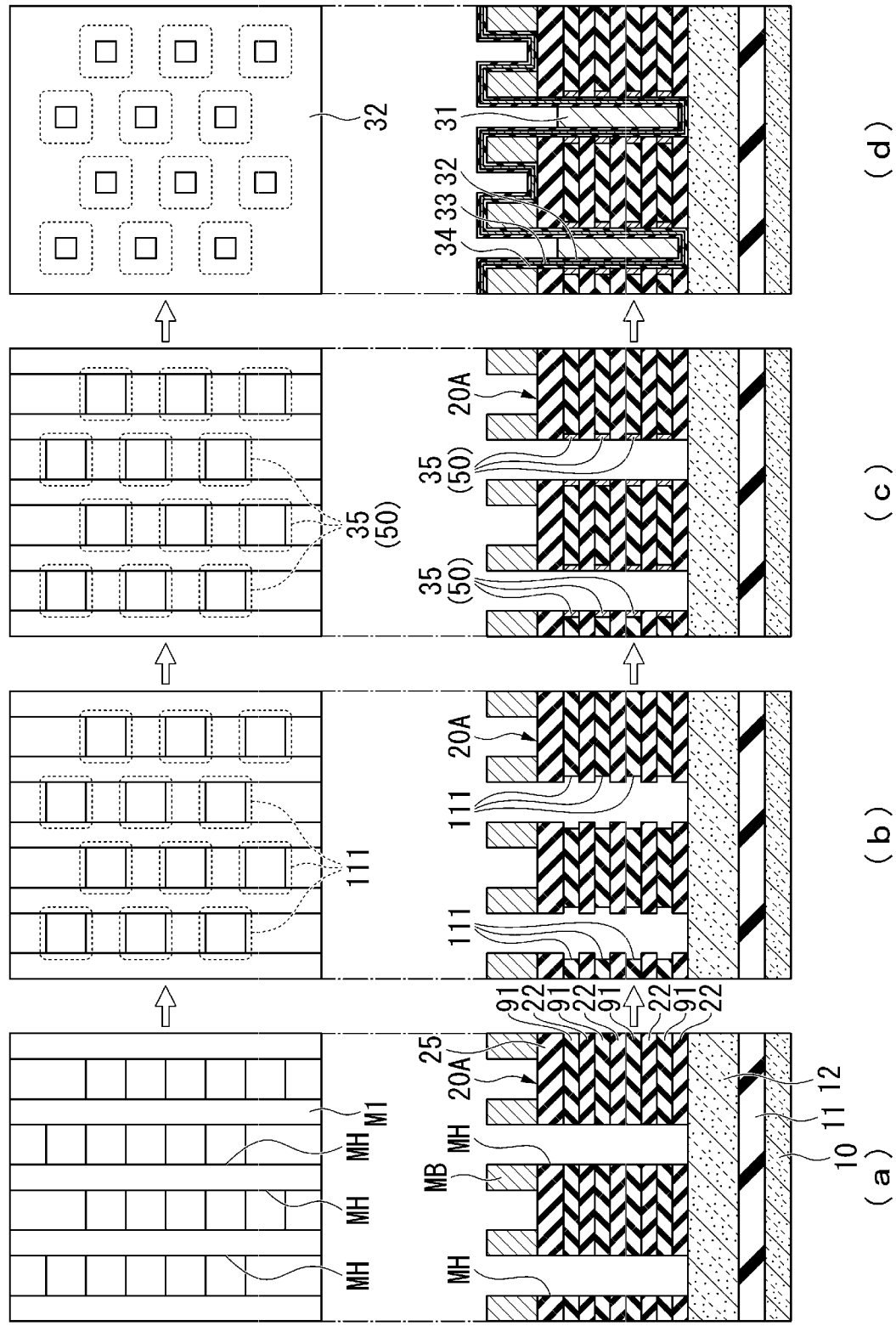
FIG. 10 is a cross-sectional view illustrating a method of manufacturing the semiconductor storage device of the second embodiment.
Figure 11:
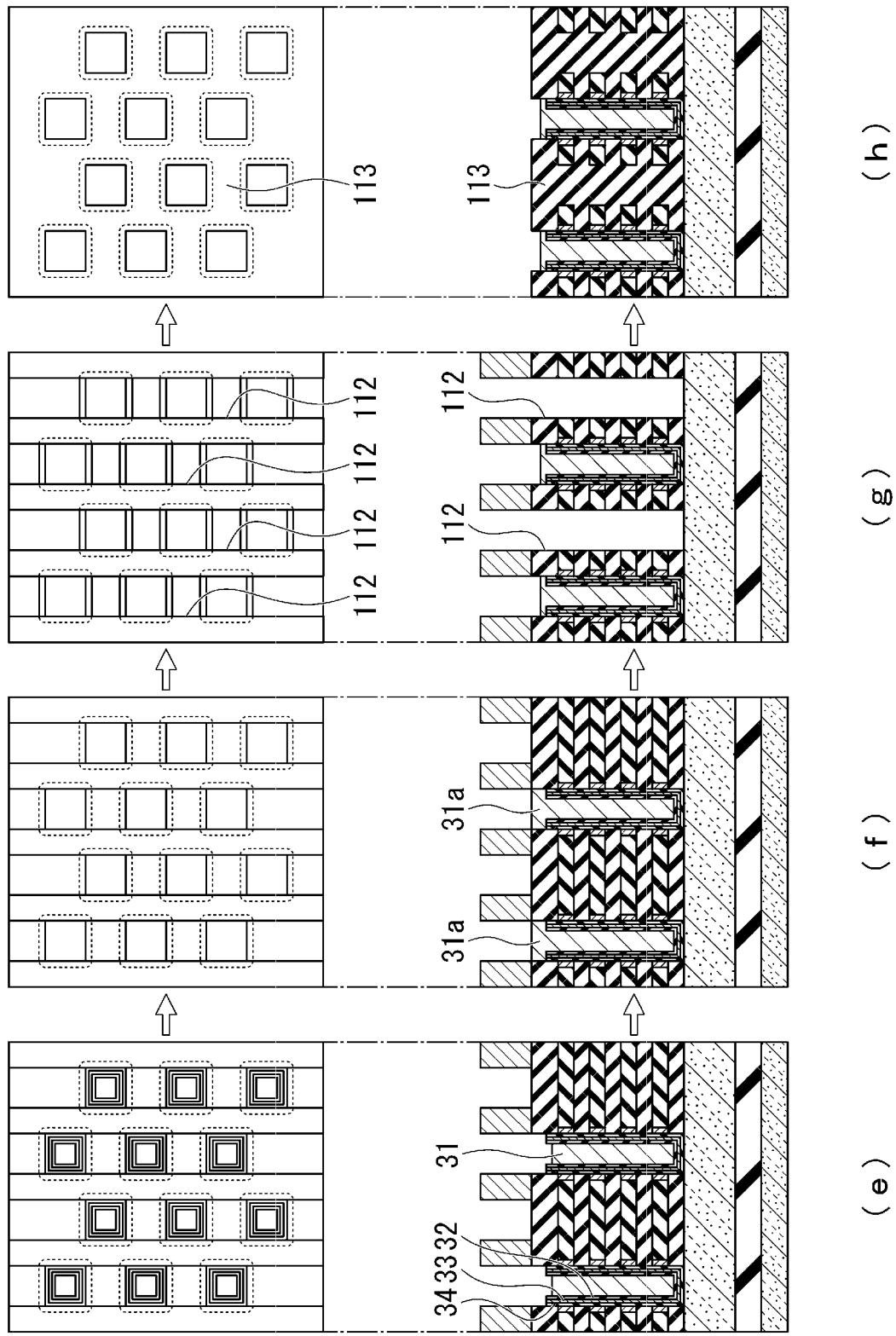
FIG. 11 is a cross-sectional view illustrating a method of manufacturing the semiconductor storage device of the second embodiment.

FIGS. 10 and 11 are cross-sectional views illustrating a method of manufacturing the semiconductor storage device 1B of the second embodiment. As illustrated in part (a) of FIG. 10, the insulating layer 11 and the semiconductor layer 12 are formed on the silicon substrate 10. Next, the insulating layer 22 made of silicon oxide (SiO$_2$) and the insulating layer 91 made of silicon nitride (SiN) are alternately stacked on the semiconductor layer 35. As a result, the intermediate stacked body 20A is formed. The insulating layer 91 is a sacrificial layer that is replaced with the functional layer 21 in a later process. Next, the insulating portion 25 is provided on the intermediate stacked body 20A. Next, a mask MB is provided on the insulating portion 25. Next, the memory hole MH is provided by etching using the mask MB. The present embodiment is different from the first embodiment in that the memory hole MH is provided instead of the memory trench MT.

Next, as illustrated in part (b) of FIG. 10, the end of the insulating layer 91 exposed to the memory hole MH in the intermediate stacked body 20A is removed by etch back. As a result, a recess 111 is formed among the plurality of insulating layers 22. Next, as illustrated in part (c) of FIG. 10, the material of the semiconductor layer 35 is supplied to the inner surface of the memory hole MH. Next, the unnecessary portions of the supplied material of the semiconductor layer 35 are removed by etch back. As a result, the intermediate stacked body 20A in which the channel portion 50 is provided in the recess 111 among the plurality of insulating layers 22 is obtained. The plurality of channel portions 50 arranged in the Z direction are separated by the insulating layer 22.

Next, as illustrated in part (d) of FIG. 10, the material of the tunnel insulating film 34, the material of the memory film 33, and the material of the block insulating film 32 are sequentially stacked on the inner surface of the memory hole MH. As a result, the tunnel insulating film 34, the memory film 33, and the block insulating film 32 are formed. Next, polysilicon (poly-Si) is provided inside the block insulating film 32, and impurities are doped. As a result, the gate wiring 31 is formed. Next, the upper end of the gate wiring 31 is removed by etch back.

Next, as illustrated in part (e) of FIG. 11, unnecessary portions of the tunnel insulating film 34, the memory film 33, and the block insulating film 32 are removed by etch back. Next, as illustrated in part (f) of FIG. 11, amorphous silicon (a-Si) is supplied and the enlarged diameter portion 31a of the gate wiring 31 is formed. Next, as illustrated in part (g) of FIG. 11, a hole 112 extending in the Z direction is provided in the region between the adjacent pillars 30B in the X direction. Next, as illustrated in part (h) of FIG. 11, an insulating material made of silicon oxide ($SiO_2$) is supplied to the hole 112 and the insulating portion 113 is formed. The insulating portion 113 includes the insulating portion 23 described with respect to the first embodiment.

With such a configuration, it is possible to provide the semiconductor storage device 1B capable of shortening the read time as in the first embodiment. In at least one embodiment, the semiconductor layer 35 is divided in the Z direction, and the channel portion 50 is provided in a region aligned with the source line SL and the drain line DL. According to such a configuration, the influence of the fringe electric field is smaller than that when the semiconductor layers 35 are connected in the Z direction. As a result, the data write operation and the data read operation become more stable.

Third Embodiment

Next, a third embodiment will be described. The third embodiment is different from the first embodiment in that the memory film 33 and the tunnel insulating film 34 are divided in the Z direction in addition to the semiconductor layer 35. The configuration of the third embodiment other than that described below is the same as the configuration of the first embodiment.

Figure 12:
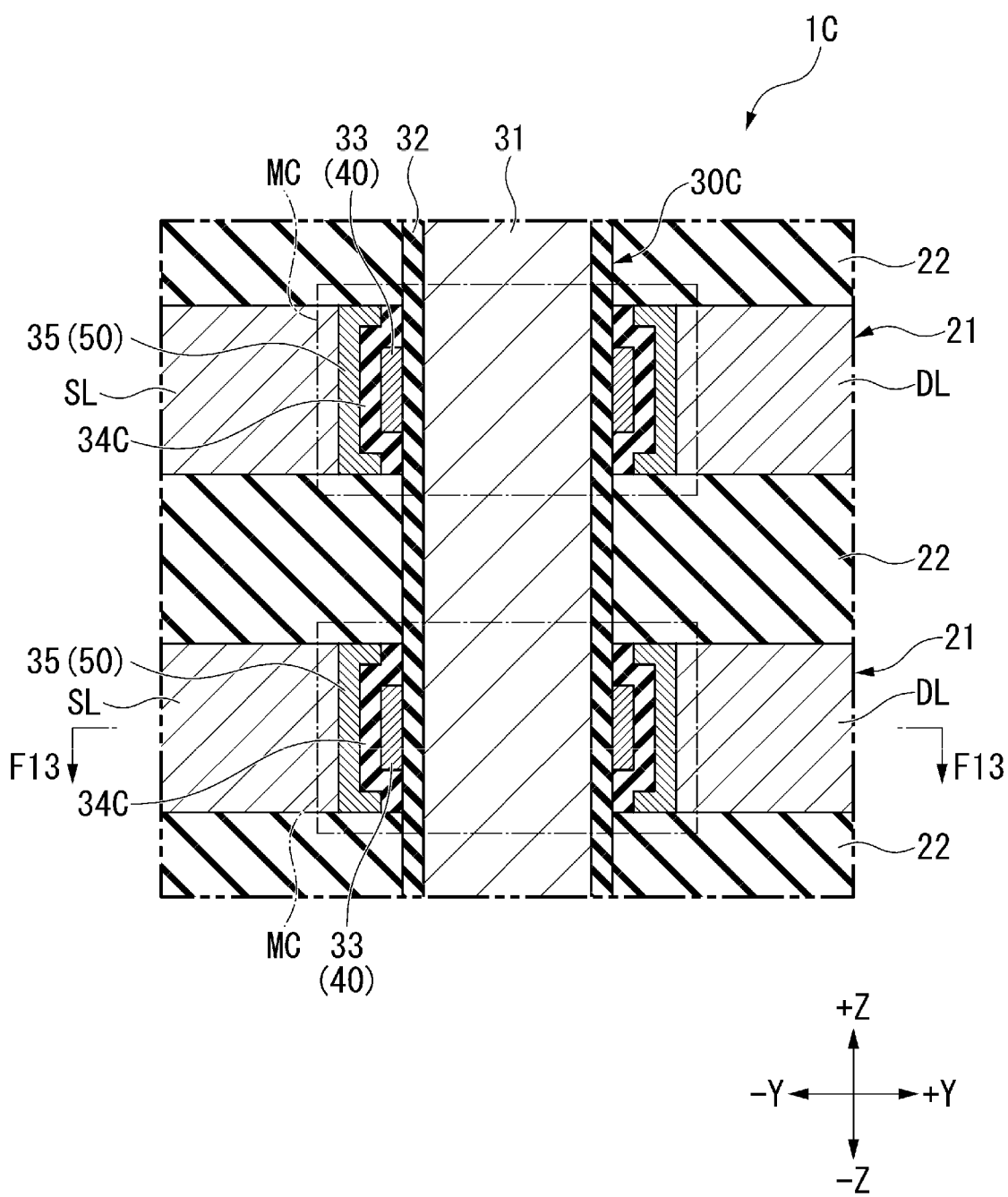
FIG. 12 is a cross-sectional view illustrating a semiconductor storage device according to a third embodiment.

FIG. 12 is a cross-sectional view illustrating the semiconductor storage device 1C of the third embodiment, and illustrates an enlarged portion of the memory cell MC. In at least one embodiment, the semiconductor storage device 1C includes, for example, a plurality of pillars 30C (only one pillar is illustrated in the drawing), a plurality of charge storage units 40, a plurality of tunnel insulating films 34C, and a plurality of channel portions 50.

Each pillar 30C includes a gate wiring 31 and a block insulating film 32. The configuration of the gate wiring 31 and the block insulating film 32 is the same as that of the first embodiment. That is, the block insulating film 32 extends in the Z direction along the gate wiring 31.

Meanwhile, the charge storage unit 40, the tunnel insulating film 34C, and the channel portion 50 are provided between two insulating layers 22 adjacent to each other in the Z direction. That is, the charge storage unit 40, the tunnel insulating film 34C, and the channel portion 50 are insulated for each functional layer 21. In at least one embodiment, the channel portion 50 has a region in the channel portion 50 that does not overlap with the charge storage unit 40 in the Y direction and the X direction (i.e., the upper end and the lower end of the channel portion 50 in FIG. 12; hereinafter, referred to as a "specific region"). A tunnel insulating film 34C is provided between the specific region of the channel portion 50 and the block insulating film 32 in the Y direction and the X direction. As a result, the channel portion 50 is provided apart from the block insulating film 32 and is not in contact with the block insulating film 32.

Figure 13:
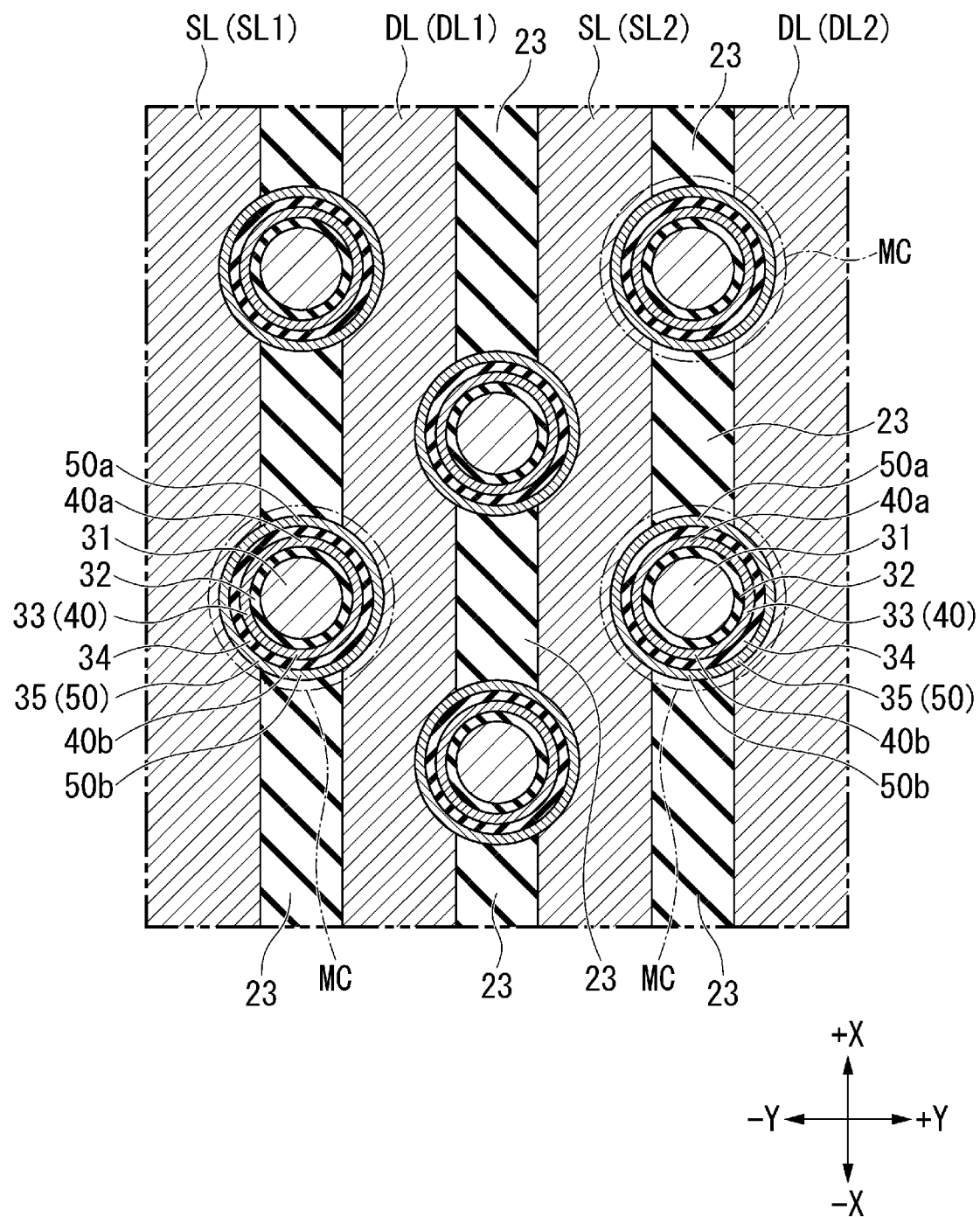
FIG. 13 is a cross-sectional view taken along line F13-F13 of the semiconductor storage device illustrated in FIG. 12.

FIG. 13 is a cross-sectional view taken along the line F13-F13 of the semiconductor storage device 1C illustrated in FIG. 12. As illustrated in FIG. 13, the charge storage unit 40, the tunnel insulating film 34C, and the channel portion 50 are formed in an annular shape surrounding the gate wiring 31.

With such a configuration, it is possible to provide the semiconductor storage device 1C capable of shortening the read time as in the first embodiment.

Fourth Embodiment

Next, a fourth embodiment will be described. The fourth embodiment is different from the first embodiment in that the memory cell MC has a charge storage unit 40D which is a floating gate electrode. The configuration of the fourth embodiment other than that described below is the same as the configuration of the first embodiment.

Figure 14:
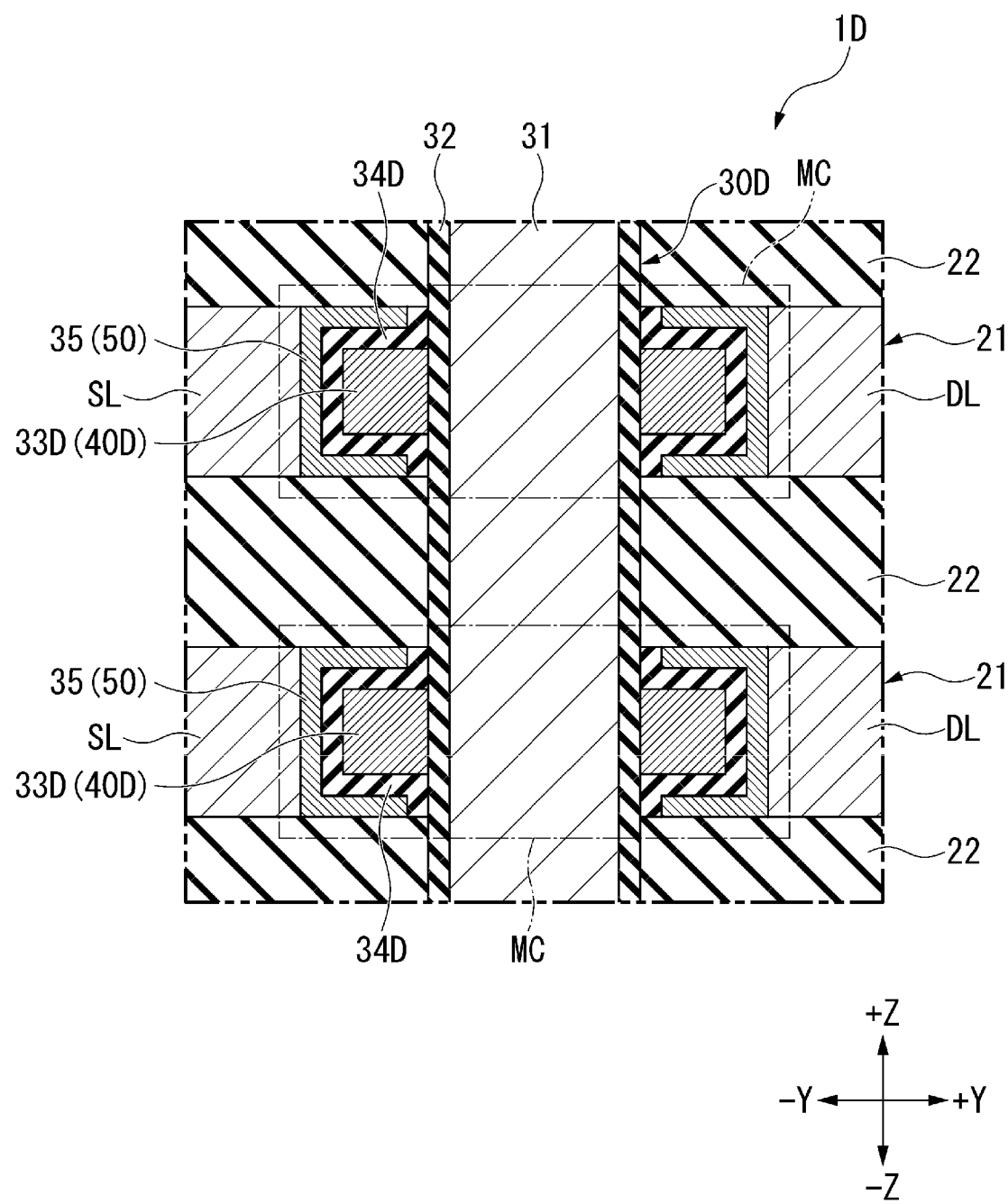
FIG. 14 is a cross-sectional view illustrating a semiconductor storage device according to a fourth embodiment.

FIG. 14 is a cross-sectional view illustrating the semiconductor storage device 1D of the fourth embodiment, and illustrates an enlarged portion of the memory cell MC. In at least one embodiment, the semiconductor storage device 1D includes, for example, a plurality of pillars 30D (only one pillar is illustrated in the drawing), a plurality of charge storage units 40D, a plurality of tunnel insulating films 34D, and a plurality of channel portions 50.

Each pillar 30D includes a gate wiring 31 and a block insulating film 32. The configuration of the gate wiring 31 and the block insulating film 32 is the same as that of the first embodiment. That is, the block insulating film 32 extends in the Z direction along the gate wiring 31.

Meanwhile, the charge storage unit 40D, the tunnel insulating film 34D, and the channel portion 50 are provided between two insulating layers 22 adjacent to each other in the Z direction. That is, the charge storage unit 40D, the tunnel insulating film 34D, and the channel portion 50 are insulated for each functional layer 21. The charge storage unit 40D is a floating gate electrode and stores data according to the amount of accumulated electric charges. In at least one embodiment, the channel portion 50 has a region in the channel portion 50 that does not overlap with the charge storage unit 40 in the Y direction and the X direction (i.e., the upper end and the lower end of the channel portion 50 in FIG. 14; hereinafter, referred to as a "specific region"). A tunnel insulating film 34D is provided between the specific region of the channel portion 50 and the block insulating film 32 in the Y direction and the X direction. As a result, the channel portion 50 is provided apart from the block insulating film 32 and is not in contact with the block insulating film 32.

With such a configuration, it is possible to provide the semiconductor storage device 1D capable of shortening the read time as in the first embodiment.

Fifth Embodiment

Next, a fifth embodiment will be described. The fifth embodiment is different from the first embodiment in that the memory cell MC has a charge storage unit 40E which is a ferroelectric substance. The configuration other than that described below is the same as the configuration of the first embodiment.

Figure 15:
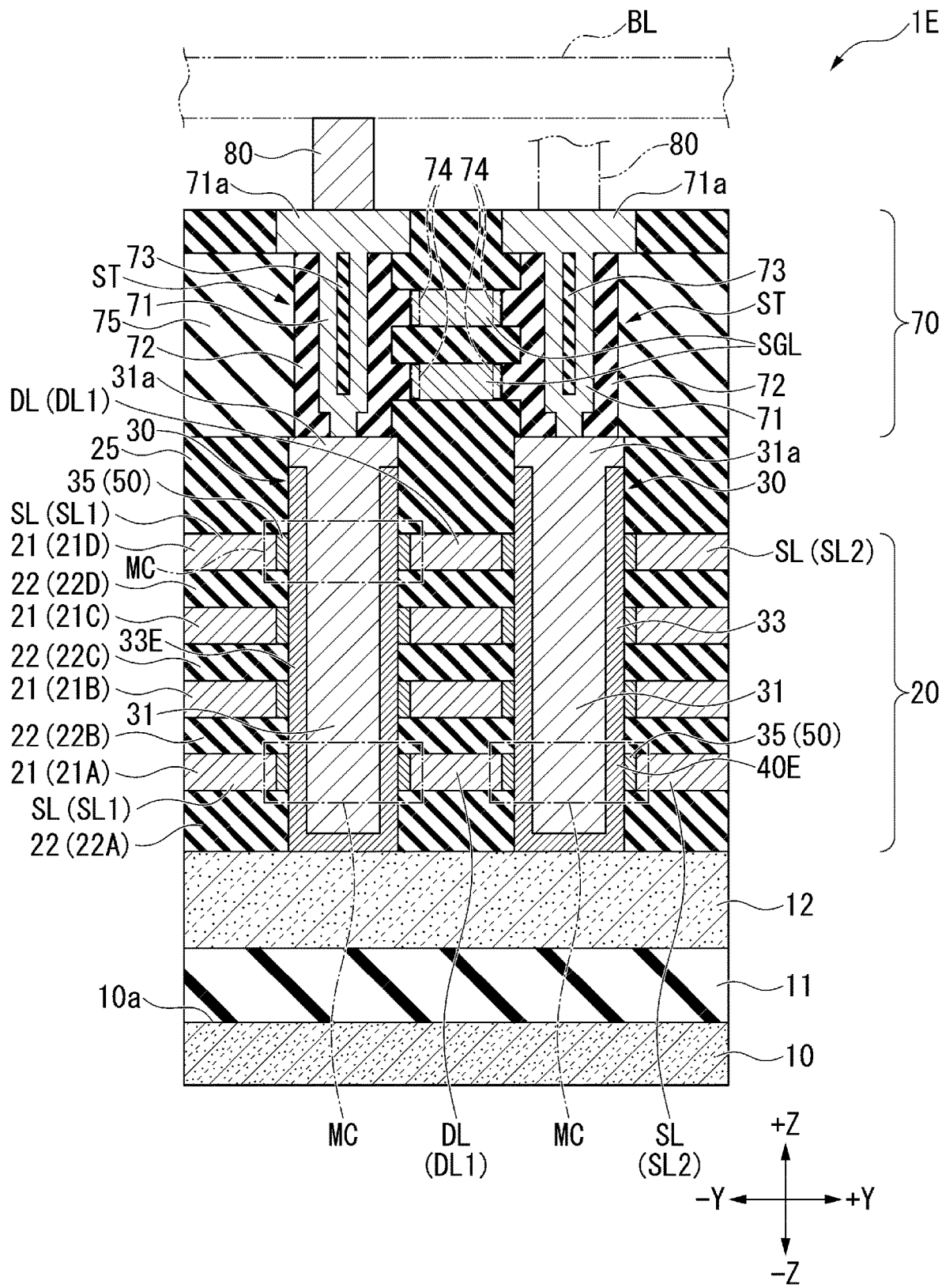
FIG. 15 is a cross-sectional view illustrating a semiconductor storage device according to a fifth embodiment.

FIG. 15 is a cross-sectional view illustrating the semiconductor storage device 1E of the fifth embodiment, and illustrates an enlarged portion related to the memory cell MC. In at least one embodiment, the semiconductor storage device 1E includes, for example, a plurality of pillars 30E and a plurality of channel portions 50. As in the second embodiment, the channel portion 50 is provided between two insulating layers 22 adjacent to each other in the Z direction.

Each pillar 30E includes a gate wiring 31 and a memory film 33E. The memory film 33E extends in the Z direction along the gate wiring 31. The memory film 33E is formed in an annular shape surrounding the gate wiring 31 when viewed in the Z direction. The memory film 33E is provided between the gate wiring 31 and the channel portion 50. In at least one embodiment, the memory film 33E extends in the Z direction so as to cover most of the pillars 30E. In at least one embodiment, the memory film 33E is a ferroelectric film constituting a ferroelectric memory (FeFET: Ferroelectric Field Effect Transistor). The charge storage unit 40E by the ferroelectric film stores data according to the direction of polarization (state of polarization reversal). The ferroelectric film is formed of a high dielectric constant material such as hafnium oxide (HfO).

In at least one embodiment, the memory film 33E includes a plurality of charge storage units 40E. Each charge storage unit 40E is a region located at the same height as the source line SL and the drain line DL in the memory film 33E. In other words, the plurality of charge storage units 40E are regions in the memory film 33E that are aligned with the first to fourth functional layers 21A to 21D in the Y direction. The charge storage unit 40E is a storage unit that can store data by storing the state of electric charge (e.g., the direction of polarization). The charge storage unit 40E changes the state of electric charge (e.g., the direction of polarization) when a voltage satisfying a predetermined condition is applied to the gate wiring 31. As a result, the charge storage unit 40E stores the data in a non-volatile manner.

With such a configuration, it is possible to provide the semiconductor storage device 1E capable of shortening the read time as in the first embodiment. Here, while the ferroelectric memory may be expected to operate at a high speed at a constant voltage, the resistance to disturbance is an issue. However, in at least one embodiment, since no current flows through the channel portion 50 of the memory cell MC other than the write target or the read target, the problem of disturbance is less likely to occur. As a result, the reliability of the semiconductor storage device 1E using the ferroelectric memory may be improved.

In at least one embodiment, the charge storage unit 40E may be provided between the two insulating layers 22 adjacent to each other in the Z direction, as in the third embodiment. Meanwhile, the channel portion 50 may be formed by the semiconductor layer 35 extending in the Z direction as in the first embodiment.

According to at least one embodiment described above, the semiconductor storage device includes a substrate, a first wiring, a second wiring, a third wiring, a fourth wiring, and a charge storage unit. The first wiring extends in a first direction along the surface of the substrate. The second wiring is aligned with the first wiring in a second direction intersecting with the first direction and extends in the first direction. The third wiring is in contact with the first wiring and the second wiring, and includes a semiconductor. The fourth wiring is located between the first wiring and the second wiring, extends in a third direction intersecting with the first direction and the second direction, and is aligned with the third wiring in at least the first direction. The charge storage unit is located between the third wiring and the fourth wiring. According to such a configuration, the read time may be shortened.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:
    a substrate having a surface;
    a first source line extending in a first direction along the surface;
    a first drain line aligned with the first source line in a second direction and extending in the first direction, the second direction intersecting with the first direction;
    a first channel portion in contact with the first source line and the first drain line, the first channel portion including a semiconductor;
    a first gate wiring located between the first source line and the first drain line, the first gate wiring extending in a third direction intersecting with the first direction and the second direction, the first gate wiring aligned with the first channel portion in the first direction; and
    a first charge storage located between the first channel portion and the first gate wiring.

2. The semiconductor storage device according to claim 1, wherein the first channel portion includes a first portion aligned with the first gate wiring in the first direction, and a second portion located on an opposite side to the first portion with respect to the first gate wiring in the first direction, and
    the first charge storage including (i) a first portion located between the first portion of the first channel portion and the first gate wiring, and (ii) a second portion located between the second portion of the first channel portion and the first gate wiring.

3. The semiconductor storage device according to claim 1, wherein the first charge storage surrounds the first gate wiring.

4. The semiconductor storage device according to claim 1, further comprising:
- a second channel portion spaced from the first channel portion in the first direction, the second channel portion in contact with the first source line and the first drain line, and the second channel portion including a semiconductor;
- a second gate wiring located between the first source line and the first drain line, the second gate wiring extending in the third direction and aligned with the second channel portion in the first direction; and
- a second charge storage located between the second channel portion and the second gate wiring.

5. The semiconductor storage device according to claim 4, further comprising:
- a first bit line located on an opposite side to the substrate with respect to the first gate wiring, the first bit line extending in the second direction;
- a second bit line located on an opposite side to the substrate with respect to the second gate wiring, the second bit line extending in the second direction;
- a first select transistor located between the first gate wiring and the first bit line; and
- a second select transistor located between the second gate wiring and the second bit line.

6. The semiconductor storage device according to claim 5, further comprising:
- a select gate line extending in the first direction, the select gate line connected to a gate electrode of the first select transistor and a gate electrode of the second select transistor.

7. The semiconductor storage device according to claim 1, further comprising:
- a second source line located on an opposite side to the first source line in the second direction with respect to the first drain line and extending in the first direction;
- a second drain line located on an opposite side to the first drain line in the second direction with respect to the second source line and extending in the first direction;
- a third channel portion in contact with the second source line and the second drain line, the third channel portion including a semiconductor;
- a third gate wiring located between the second source line and the second drain line, the third gate wiring extending in the third direction, and the third gate wiring aligned with the third channel portion in at least the first direction; and
- a third charge storage located between the third channel portion and the third gate wiring.

8. The semiconductor storage device according to claim 7, further comprising:
- a fourth channel portion spaced from the third channel portion in the first direction, and in contact with the second source line and the second drain line, the third gate wiring including a semiconductor;
- a fourth gate wiring located between the second source line and the second drain line, and extending in the third direction, the fourth gate wiring aligned with the fourth channel portion in at least the first direction; and
- a fourth charge storage located between the fourth channel portion and the fourth gate wiring.

9. The semiconductor storage device according to claim 7, further comprising:
- a first bit line on an opposite side to the substrate with respect to the first gate wiring and the third gate wiring, the first bit line extending in the second direction;
- a first select transistor located between the first gate wiring and the first bit line; and
- a third select transistor located between the third gate wiring and the first bit line.

10. The semiconductor storage device according to claim 1, further comprising:
- a third source line located away from the first source line in the third direction, and extending in the first direction, the third source line aligned with the first gate wiring in the second direction;
- a third drain line located away from the first drain line in the third direction, and extending in the first direction, the third drain line aligned with the first gate wiring in the second direction;
- a fifth channel portion in contact with the third source line and the third drain line, and including a semiconductor, the fifth channel portion aligned with the first gate wiring in at least the first direction; and
- a fifth charge storage located between the fifth channel portion and the first gate wiring.

11. The semiconductor storage device according to claim 10, further comprising:
- a semiconductor layer extending in the third direction along the first gate wiring and including the first channel portion and the fifth channel portion.

12. The semiconductor storage device according to claim 10, further comprising:
- an insulating portion provided between the first channel portion and the fifth channel portion in the third direction, the insulating portion configured to separate the first channel portion and the fifth channel portion.

13. A semiconductor storage device comprising:
- a substrate having a surface;
- a first wiring extending in a first direction along the surface;
- a second wiring aligned with the first wiring in a second direction extending in the first direction, the second direction intersecting with the first direction;
- a third wiring in contact with the first wiring and the second wiring, the third wiring including a semiconductor;
- a fourth wiring located between the first wiring and the second wiring, and extending in a third direction intersecting with the first direction and the second direction, the fourth wiring aligned with the third wiring in at least the first direction; and
- a first charge storage located between the third wiring and the fourth wiring.

14. The semiconductor storage device according to claim 13, further comprising:
- a plurality of first wirings extending in the first direction;
- a plurality of second wirings extending in the second direction;
- a plurality of third wirings in contact with respective ones of the plurality of first wirings and of the plurality of second wirings, the plurality of third wirings including a semiconductor;
- a plurality of fourth wirings located between any one of the plurality of first wirings and any one of the plurality of second wirings, and extending in the third direction; and
- a second charge storage,
- wherein the second charge storage is located between respective ones of the plurality of third wirings and of the plurality of fourth wirings, the second charge storage being aligned with the first charge storage in the first direction.

15. The semiconductor storage device according to claim 14, further comprising: a third charge storage,
   wherein the plurality of first wirings include two or more first wirings aligned in the second direction,
   the plurality of second wirings include two or more second wirings aligned in the second direction, and
   the third charge storage is located between respective ones of the plurality of third wirings and of the plurality of fourth wirings, the third charge storage is aligned with the first charge storage unit in the second direction.

16. The semiconductor storage device according to claim 14, further comprising: a fourth charge storage,
   wherein the plurality of first wirings include two or more first wirings aligned in the third direction,
   the plurality of second wirings include two or more second wirings aligned in the third direction, and
   the fourth charge storage is located between respective ones of the plurality of third wirings and of the plurality of fourth wirings, the fourth charge storage being aligned with the first charge storage in the third direction.

* * * * *